United States Patent
Kim et al.

(10) Patent No.: US 9,312,016 B2
(45) Date of Patent: Apr. 12, 2016

(54) MULTI-LEVEL CELL MEMORY DEVICE AND METHOD OF OPERATING MULTI-LEVEL CELL MEMORY DEVICE

(71) Applicants: Kyungryun Kim, Daejeon (KR); Sangyong Yoon, Seoul (KR)

(72) Inventors: Kyungryun Kim, Daejeon (KR); Sangyong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 82 days.

(21) Appl. No.: 14/135,734

(22) Filed: Dec. 20, 2013

(65) Prior Publication Data
US 2014/0185377 A1 Jul. 3, 2014

(30) Foreign Application Priority Data

Dec. 28, 2012 (KR) .................. 10-2012-0156742

(51) Int. Cl.
| | |
|---|---|
| *G11C 11/56* | (2006.01) |
| *G11C 16/26* | (2006.01) |
| *H01L 29/792* | (2006.01) |
| *H01L 27/115* | (2006.01) |
| *G11C 16/04* | (2006.01) |

(52) U.S. Cl.
CPC ............ *G11C 16/26* (2013.01); *G11C 11/5642* (2013.01); *H01L 27/11582* (2013.01); *H01L 29/7926* (2013.01); *G11C 16/0483* (2013.01)

(58) Field of Classification Search
CPC ........................................................ G11C 11/56
USPC .................................................... 365/185.03
See application file for complete search history.

(56) References Cited

U.S. PATENT DOCUMENTS

| | | | |
|---|---|---|---|
| 7,954,037 B2 | 5/2011 | Lasser et al. | |
| 8,068,360 B2 | 11/2011 | Anholt | |
| 8,174,857 B1 | 5/2012 | Sommer et al. | |
| 8,239,747 B2 | 8/2012 | Cho et al. | |
| 8,259,506 B1 | 9/2012 | Sommer et al. | |
| 8,429,493 B2 | 4/2013 | Sokolov et al. | |
| 2007/0180346 A1* | 8/2007 | Murin ......................... | 714/755 |
| 2008/0209111 A1* | 8/2008 | Kang ........................... | 711/103 |
| 2008/0244338 A1* | 10/2008 | Mokhlesi et al. ............ | 714/702 |
| 2009/0049364 A1 | 2/2009 | Jo et al. | |
| 2009/0292973 A1* | 11/2009 | Seol et al. ..................... | 714/763 |
| 2009/0319859 A1 | 12/2009 | Alrod et al. | |
| 2011/0075485 A1* | 3/2011 | Fukuda et al. ........... | 365/185.17 |
| 2011/0235415 A1 | 9/2011 | Park et al. | |
| 2012/0008397 A1* | 1/2012 | Shin et al. ................ | 365/185.11 |
| 2012/0134207 A1 | 5/2012 | Yoon et al. | |
| 2012/0213004 A1* | 8/2012 | Yun et al. ................. | 365/185.11 |

* cited by examiner

*Primary Examiner* — Min Huang
(74) *Attorney, Agent, or Firm* — Volentine & Whitt, PLLC

(57) ABSTRACT

A read method of a multi-level cell memory device includes receiving a first read command, and reading first and second hard decision data by performing first and second hard decision read operations using a first hard decision read voltage and a second hard decision read voltage, respectively, the second hard decision read voltage being higher than the first hard decision read voltage. The method further includes selecting one of the first and second hard decision read voltages, reading first soft decision data by performing a first soft decision read operation using a plurality of soft decision read voltages having voltage levels which are different from that of the selected one of the first and second hard decision read voltages, and providing the first soft decision data to a memory controller for first error correction code (ECC) decoding.

5 Claims, 21 Drawing Sheets

MULTI-LEVEL CELL MEMORY DEVICE AND METHOD OF OPERATING MULTI-LEVEL CELL MEMORY DEVICE

CROSS-REFERENCE TO RELATED APPLICATIONS

A claim for priority under 35 U.S.C. §119 is made to Korean Patent Application No. 10-2012-0156742 filed Dec. 28, 2012, in the Korean Intellectual Property Office, the entire contents of which are hereby incorporated by reference.

BACKGROUND

The inventive concepts described herein relate to semiconductor memory devices, and more particularly, to multi-level cell (MLC) memory devices and related methods of operation.

Memory devices are generally referred to as either volatile or non-volatile. A volatile memory device is characterized by the loss of stored data at a power-off state, whereas in contrast a non-volatile memory device is characterized by the retention of stored data at a power-off state. Examples of non-volatile memory include read only memory (ROM), electrically erasable programmable ROM (EEPROM), and the like.

Developed from EEPROM technology, a flash memory device is a type of non-volatile memory in which erase operations are carried out in units of memory blocks, and program operations are carried out in units of bits.

Flash memory is programmed by controlling a threshold voltage state of a memory cell. However, the threshold voltage of a memory cell can vary or drift from a programmed threshold voltage. This can result from a variety of different causes, such as floating gate coupling, charge loss over time, and so on. Any such variation in the programmed threshold voltage of a memory cell can adversely impact the reliability of a read operation. This is particularly problematic in the case of multi-level cell memory devices in which the margin between adjacent threshold voltage states is relatively small.

SUMMARY

One aspect of embodiments of the inventive concept is directed to provide a read method of a multi-level cell memory device which is connected with a memory controller. The method includes receiving a first read command, and reading first and second hard decision data by performing first and second hard decision read operations using a first hard decision read voltage and a second hard decision read voltage, respectively, the second hard decision read voltage being higher than the first hard decision read voltage. The method further includes selecting one of the first and second hard decision read voltages, reading first soft decision data by performing a first soft decision read operation using a plurality of soft decision read voltages having respective voltage levels which are different from that of the selected one of the first and second hard decision read voltages, and providing the first soft decision data to the memory controller for first error correction code (ECC) decoding.

Another aspect of embodiments of the inventive concept is directed to provide a non-volatile memory device which includes a memory cell array including a plurality of memory cells connected with a word line and a bit line, a page buffer connected with the memory cell array and including a plurality of latches, a voltage generator configured to generate a plurality of hard decision read voltages and a plurality of soft decision voltages to be applied to the memory cell array, and control logic configured to control the page buffer and the voltage generator. The control logic is configured to perform a plurality of hard decision read operations on the memory cell array using a plurality of hard decision read voltages, to select one of the plurality of hard decision read voltages, to obtain soft decision data using a plurality of soft decision read voltages having voltage levels which are different from that of the selected one of the hard decision voltages, and to provide the soft decision data to an external device.

Yet another aspect of embodiments of the inventive concept is directed to provide a read method of a multi-level cell memory device which is connected with a memory controller. The method includes receiving a first read command and performing first and second hard decision read operations using respective first and second hard decision read voltages to read first and second hard decision data. The method further includes, upon a fail of error bit correction on the first and second hard decision data, receiving a second read command and reading first soft decision data using a plurality of soft decision read voltages corresponding to the first hard decision read voltage, and providing the first soft decision data to an external device for first error correction code (ECC) decoding.

Other details of the inventive concept may be included in the detailed description and drawings.

With embodiments of the inventive concept, it is possible to improve a read speed and reduce power consumption at execution of a soft decision read operation of a multi-bit non-volatile memory. Also, it is possible to improve the reliability of a non-volatile memory.

BRIEF DESCRIPTION OF THE FIGURES

The above and other objects and features will become apparent from the detailed description that follows with reference to the accompanying figures, wherein like reference numerals refer to like parts throughout the various figures unless otherwise specified, and wherein.

DETAILED DESCRIPTION

Figure 1:
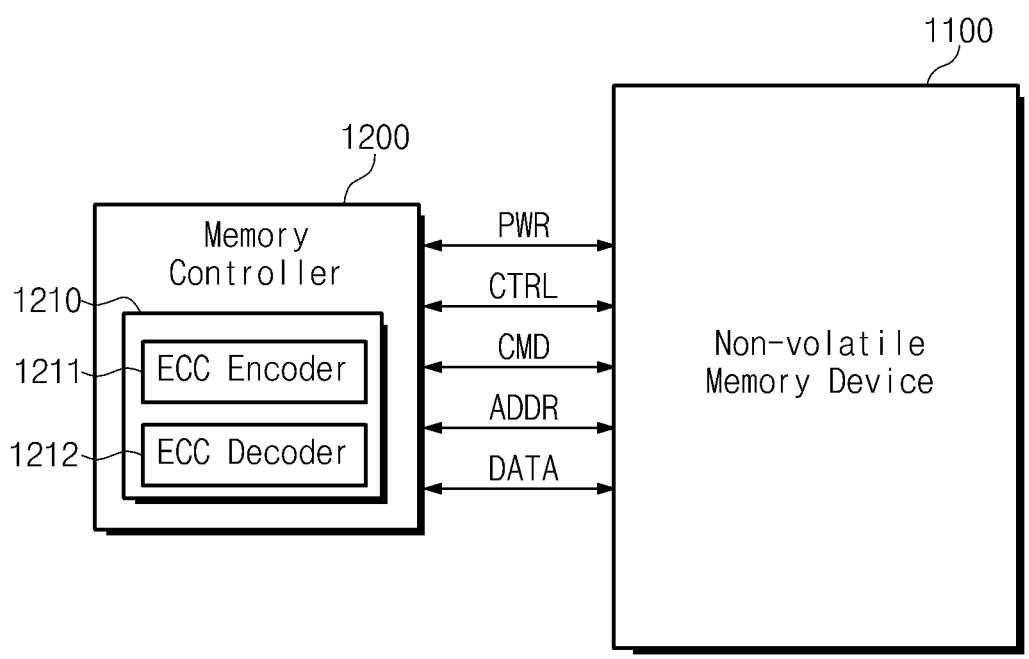
FIG. 1 is a block diagram schematically illustrating a non-volatile memory system according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a non-volatile memory system according to an embodiment of the inventive concept. Referring to FIG. 1, a non-volatile memory system 1000 may include a non-volatile memory device 1100 and a memory controller 1200. The non-volatile memory system 1000 is not limited by type, and may include any of a variety of non-volatile memory based data storage media such as a memory card, a USB memory, a solid state drive (SSD), and so on.

The non-volatile memory device 1100 may perform an erase, write or read operation according to a control of the memory controller 1200. The non-volatile memory device 1100 may receive a command CMD, an address ADDR and data DATA through input/output lines. The non-volatile memory device 1100 may receive a power PWR through a power line and a control signal CTRL through a control line. The control signal may include a command latch enable (CLE) signal, an address latch enable (ALE) signal, a chip enable (nCE) signal, a write enable (nWE) signal, a read enable (nRE) signal, and so on.

The memory controller 1200 may control an overall operation of the non-volatile memory device 1100. The memory controller 1200 may include an ECC engine 1210 for correcting error bits. The ECC engine 1210 may include an ECC encoder 1211 and an ECC decoder 1212.

The ECC encoder 1211 may perform error correction decoding on data to be programmed at the non-volatile memory device 1100 to form data to which parity bits are added. The parity bits may be stored at the non-volatile memory device 1100.

The ECC decoder 1212 may perform error correction decoding on data read from the non-volatile memory device 1100. The ECC decoder 1212 may determine whether the error correction decoding is successful, and may output an instruction signal according to the determination result. The ECC decoder 1212 may correct error bits of data using parity bits generated at ECC encoding.

In a case where the number of error bits exceeds a correctable error bit limit, the ECC engine 1210 may not correct the error bits. In this case, the ECC engine 1210 may generate an error correction fail signal.

The ECC engine 1210 and the inventive concept is not limited by the error correction algorithms utilized, and may correct an error using any of a variety of different techniques. Examples include LDPC (low density parity check) code, a BCH code, a turbo code, an RS (Reed-Solomon code), a convolution code, an RSC (Recursive Systematic Code), or coded modulation such as TCM (Trellis-Coded Modulation), BCM (Block Coded Modulation), and so on. The ECC engine 1210 may include an error correction circuit, an error correction system, and an error correction device.

As described above, when the number of error bits exceeds a correctable error bit limit, the ECC engine 1210 may generate an error correction fail signal. With embodiments of the inventive concept, since the ECC engine 1210 performs an error bit correcting operation using hard decision read data and soft decision data, an error bit correction capacity may be improved.

Figure 2A:
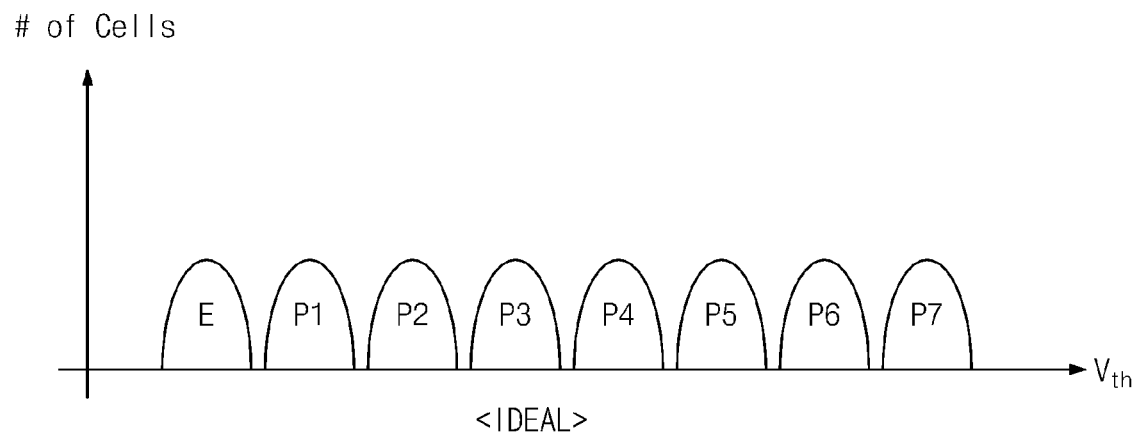
FIG. 2A is a diagram schematically illustrating threshold voltage distributions corresponding to program and erase states after programming of a 3-bit multi-level cell (3-bit MLC) non-volatile memory device.

FIG. 2A is a diagram schematically illustrating threshold voltage distributions corresponding to program and erase states after programming of a multi-level cell (3-bit MLC) non-volatile memory device. In an MLC non-volatile memory device (e.g., a flash memory device) where k-bit data is programmed at a memory cell, a memory cell may have one of $2^k$ threshold voltage distributions. Thus, in the case of 3-bit MLC, a memory cell may have on of 8 threshold voltage distributions.

Threshold voltages of memory cells programmed with the same data may form a particular range of threshold voltage distribution due to a characteristic difference between memory cells. The threshold voltage distributions may correspond to $2^k$ data values which are generated by k data bits. In a 3-bit MLC, as illustrated in FIG. 2A, threshold voltage distributions corresponding to seven program states P1 to P7 and a threshold voltage distribution corresponding to an erase state may be formed. FIG. 2A shows such an ideal case in which threshold voltage distributions do not overlap and have a read voltage margin there between.

Figure 2B:
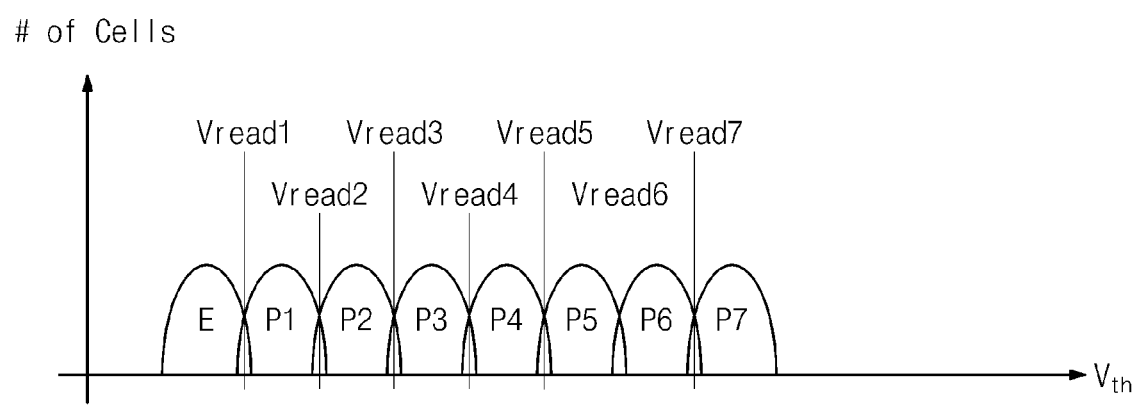
FIG. 2B is a diagram schematically illustrating threshold voltage distributions of program and erase states which have varied due to characteristic deterioration of memory cells after a 3-bit MLC non-volatile memory device is programmed.

FIG. 2B is a diagram schematically illustrating threshold voltage distributions of program and erase states which have varied of time. Here, for example, the memory cells are 3-bit MLC flash memory cells. Characteristic threshold voltage deterioration of the memory cells may occur after the memory cells are programmed and then subjected to iterative program and read operations.

In the example of flash memory, the memory cell may experience a phenomenon in which electrons trapped at a floating gate or tunnel oxide film are discharged over time. This may be referred to as charge loss. The charge loss may be accelerated when the tunnel oxide film is deteriorated by iterative program and erase operations. The charge loss may result in a decrease in a threshold voltage of a memory cell. When viewed schematically as in FIG. 2B, a threshold voltage distribution may be shifted toward a left side.

In the meantime, program disturbance, erase disturbance and/or back pattern dependency phenomenon may cause an increase in threshold voltages.

As characteristics of memory cells are deteriorated as described above, threshold voltage distributions of adjacent states may be overlapped as illustrated in FIG. 2B.

If a particular read voltage is applied to a selected word line under a condition where threshold voltage distributions are overlapped, read data may include a significant number of errors. For example, if a state of a memory cell sensed when a read voltage Vread3 is applied to a selected word line is an on state, the on state may indicate read data existing on a state S2. If a state of a memory cell sensed when the read voltage Vread3 is applied to the selected word line is an off state, the off state may indicate read data existing on a state S3. In a case where threshold voltage distributions are overlapped, however, a memory cell which should be read as an off state may be read as an on state. In short, if threshold voltage distributions are overlapped as illustrated in FIG. 2B, read data may include a significant number of errors.

Figure 3:
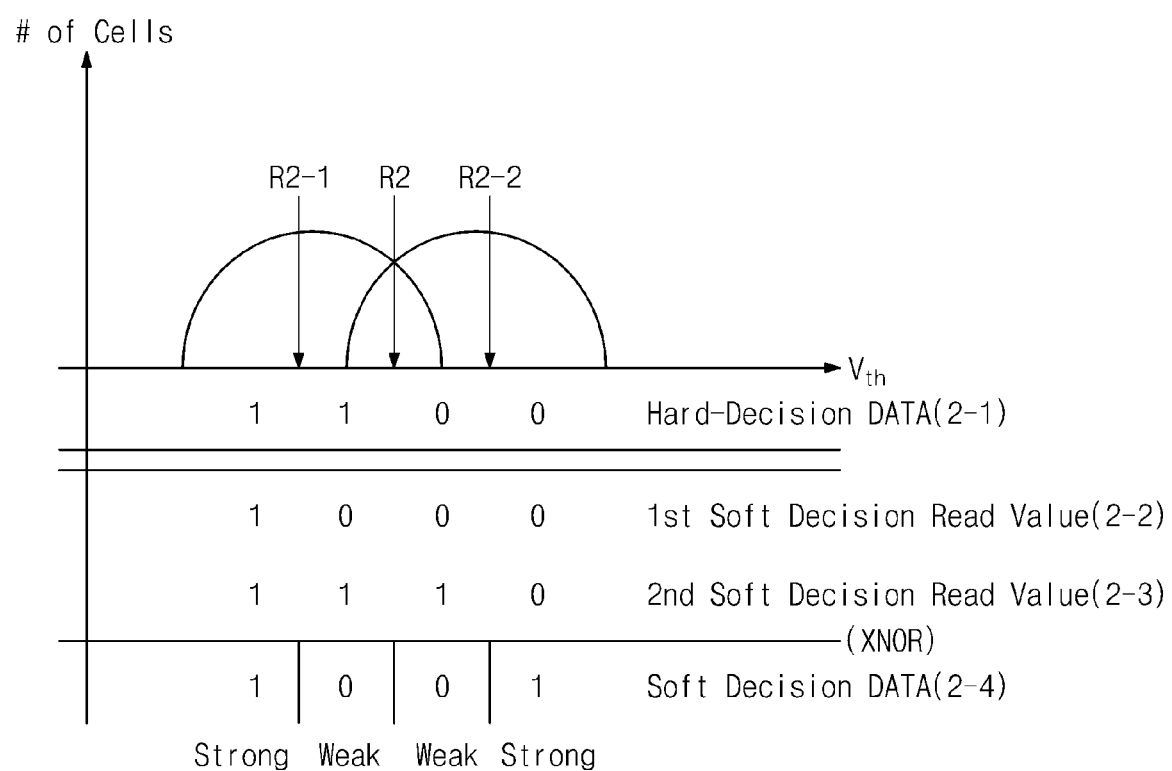
FIG. 3 is a diagram schematically illustrating read voltages at a 2-bit soft decision read operation and formation of soft decision data.

FIG. 3 is a diagram schematically illustrating read voltages at a 2-bit soft decision read operation and formation of soft decision data. A read command may include a hard decision read command and a soft decision read command.

A hard decision read operation may refer to a read operation on programmed data. When a hard decision read voltage is applied to a selected word line, data 1 or data 0 may be read according to an on or off state of a selected memory cell. Referring to FIG. 3, a symbol "R2" may indicate a hard decision read voltage. If a memory cell is decided as an on state upon application of the hard decision read voltage R2, hard decision data 2-1 may be "1". If a memory cell is decided as an off state upon application of the hard decision read voltage R2, the hard decision data 2-1 may be "0". A soft decision read operation refers to an operation for adding to the reliability of hard decision read data by using a plurality of variable read voltages (or, soft decision read voltages) having voltage levels different from that of the hard decision read voltage R2.

A 2-bit soft decision read operation may be performed using soft decision read voltages R2-1 and R2-2. First soft decision read value 2-2 decided according to an on or off state of a memory cell upon application of the soft decision read voltages R2-1 may be "1", "0", "0", "0". Second soft decision read value 2-3 decided according to an on or off state of a memory cell upon application of the soft decision read voltages R2-2 may be "1", "1", "1", "0".

Soft decision data 2-4 may be decided by performing a logic gate operation on the first soft decision read value 2-2 and the second soft decision read value 2-3. In particular, soft decision data may be generated through an XNOR operation. The soft decision data 2-4 thus generated may be provided to an ECC decoder 1212 of a memory controller 1200 (refer to FIG. 1). The soft decision data may indicate the reliability on hard decision data. For example, if the soft decision data 2-4 is "1", the reliability of the hard decision data may be "strong". On the other hand, if the soft decision data 2-4 is "0", the reliability of the hard decision data may be "weak".

Figure 4:
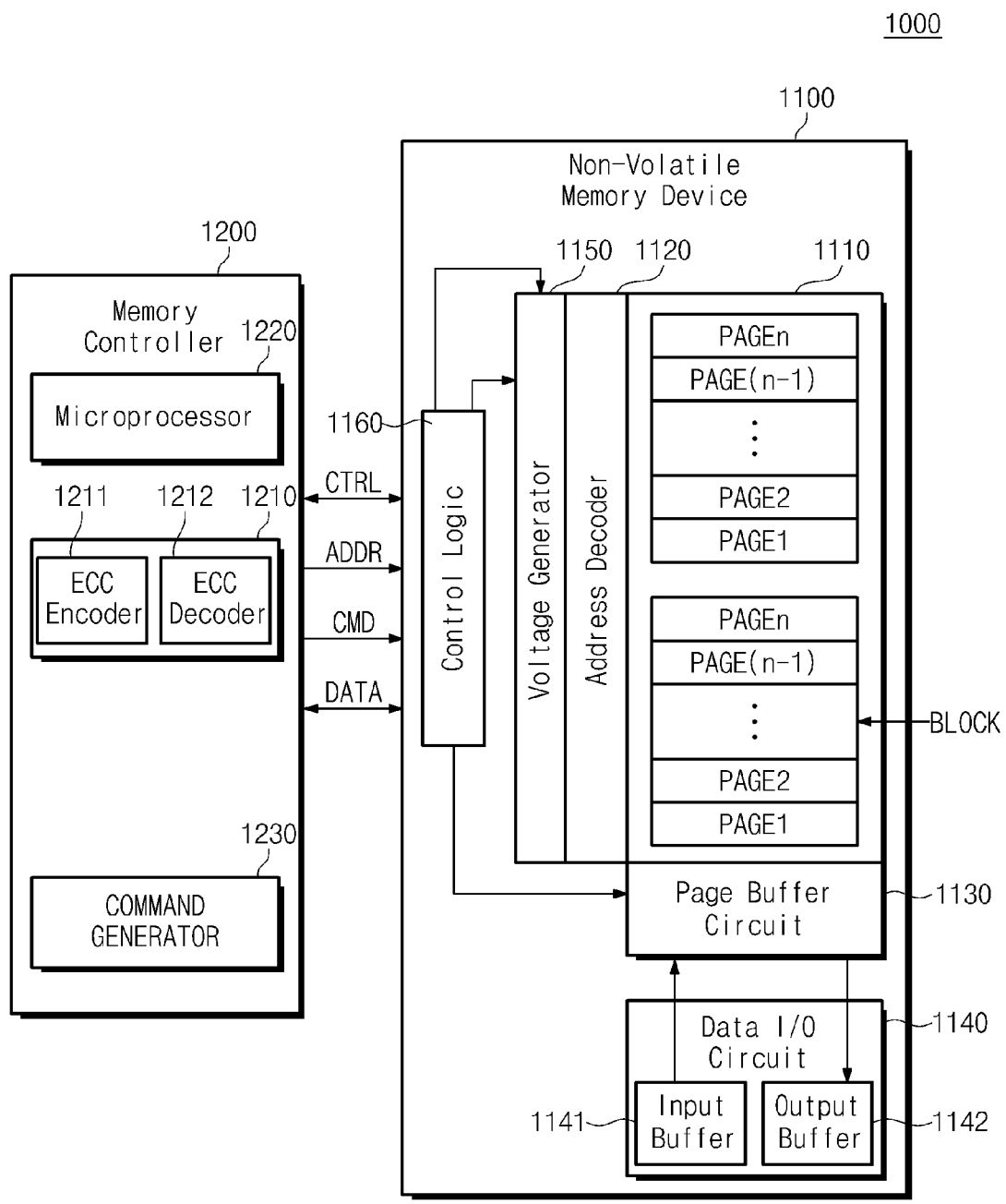
FIG. 4 is a block diagram schematically illustrating a memory system according to an embodiment of the inventive concept.

FIG. 4 is a block diagram schematically illustrating a memory system according to an embodiment of the inventive concept. Referring to FIG. 4, a memory system 1000 may include a non-volatile memory device 1100 and a memory controller 1200. Here, the non-volatile memory device 1100 may be a flash memory device.

The non-volatile memory device 1100 may include a memory cell array 1110, an address decoder 1120, a page buffer circuit 1130, a data input/output circuit 1140, a voltage generator 1150, and control logic 1160.

The memory cell array 1110 may be formed of a plurality of memory blocks. Each memory block may include a plurality of pages PAGE1 to PAGEn. Here, a page may mean a set of memory cells connected with a word line. Program and read operations may be performed in the unit of a page, and an erase operation may be performed in the unit of a block.

The address decoder 1120 may be connected to the memory cell array 1110 through word lines, and may receive a word line voltage from the voltage generator 1150. At a program or read operation, the address decoder 1120 may provide a program or read voltage to a word line corresponding to an address ADDR.

The page buffer circuit 1130 may be connected to the memory cell array 1110 through bit lines. The page buffer circuit 1130 may include page buffers each connected with one or more bit lines, and each page buffer may include a plurality of latches. The page buffer circuit 1130 may temporarily store data to be programmed at a selected page or data read from the selected page.

The data input/output circuit 1140 may include an input buffer 1141 and an output buffer 1142. The input buffer 1141 may transfer data input from the memory controller 1200 to the page buffer circuit 1130. The output buffer 1142 may provide data input from the page buffer circuit 1130 to the memory controller 1200.

The voltage generator 1150 may receive a power PWR from the memory controller 1200 to generate a word line voltage needed to read or write data. The word line voltage may be provided to the address decoder 1120.

The control logic 1160 may control reading, programming, and erasing of the non-volatile memory device 1100 using a command CMD, an address ADDR, and a control signal CTRL.

As illustrated in FIG. 4, the memory controller 1200 may include an ECC engine 1210, a microprocessor 1220, and a command generator 1230. The ECC engine 1210 may include an ECC encoder 1211 and an ECC decoder 1212 as described above.

The microprocessor 1220 may control an overall operation of the memory controller 1200. The microprocessor 1220 may analyze a command provided from a host to control an overall operation of the non-volatile memory device 1100.

The command generator 1230 may analyze a command from the microprocessor 1220 to generate a command suitable for the non-volatile memory device 1100 according to the analyzing result. The command generator 1230 may apply the generated command to the non-volatile memory device 1100. In particular, the command generator 1230 may provide a hard decision read command and a soft decision command to the non-volatile memory device 1100.

Figure 5:
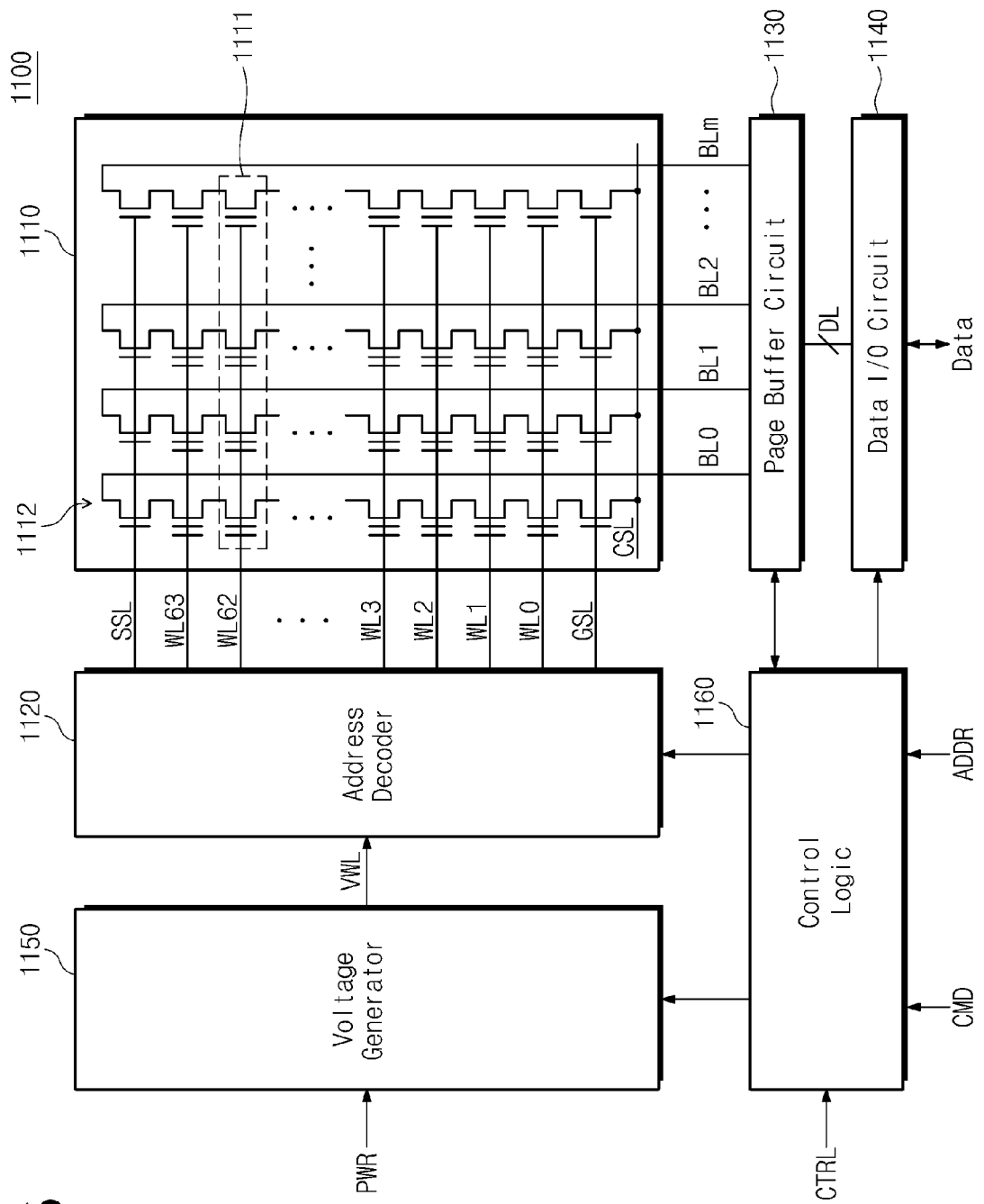
FIG. 5 is a block diagram schematically illustrating a flash memory device as an example of a non-volatile memory device of FIG. 4.

FIG. 5 is a block diagram schematically illustrating a flash memory device as an example of a non-volatile memory device of FIG. 4. Referring to FIG. 5, a flash memory device 1100 may include a memory cell array 1110, an address decoder 1120, a page buffer circuit 1130, a data input/output circuit 1140, a voltage generator 1150, and control logic 1160.

In FIG. 5, there is illustrated an example in which the memory cell array 1110 includes a single memory block. However, it will be well understood that the memory cell array 1110 can include multiple memory blocks. A reference number "1111" may indicate a page. Respective pages may be formed of a plurality of memory cells. Each memory cell may be formed of a cell transistor having a control gate and a floating gate.

The memory cell array 1110 may include a plurality of cell strings 1112. Each cell string 1112 may include a string select transistor connected with a string select line SSL, a plurality of memory cells each connected with a plurality of word lines WL0 to WL63 and a ground select transistor connected with a ground select line GSL. In each cell string, a string select transistor may be connected with a bit line and a ground select transistor may be connected with a common source line CSL.

A memory cell may store one data bit or two or more data bits. A memory cell storing one data bit may be referred to as a single level cell (SLC) or a single bit cell. A memory cell storing two or more data bits may be referred to as a multi-level cell (MLC) or a multi-bit cell.

In a 2-bit MLC flash memory device, two logical pages may be stored at each physical page (e.g., physical page 1111 of FIG. 5). Here, a logical page may indicate a set of data bits to be programmed at a physical page at the same time. In a 3-bit MLC flash memory device, three logical pages may be stored at a physical page.

Referring to FIG. 5, the address decoder 1120 may be connected with the memory cell array 1110 through the select lines SSL and GSL and the word lines WL0 to WL63. At a read operation, the address decoder 1120 may select a word line (e.g., WL62) in response to an address ADDR.

The page buffer circuit 1130 may be connected with the memory cell array 1110. The page buffer circuit 1130 may include a plurality of page buffers, each of which includes a plurality of latches. A page buffer may be connected with a bit line. This structure may be referred to as an all bit line structure. A page buffer may be connected with two or more bit lines. This structure may be referred to as a shield bit line structure. The page buffer circuit 1130 may temporarily store data to be programmed at a selected page 1111 or data read from the selected page 1111.

Figure 6:
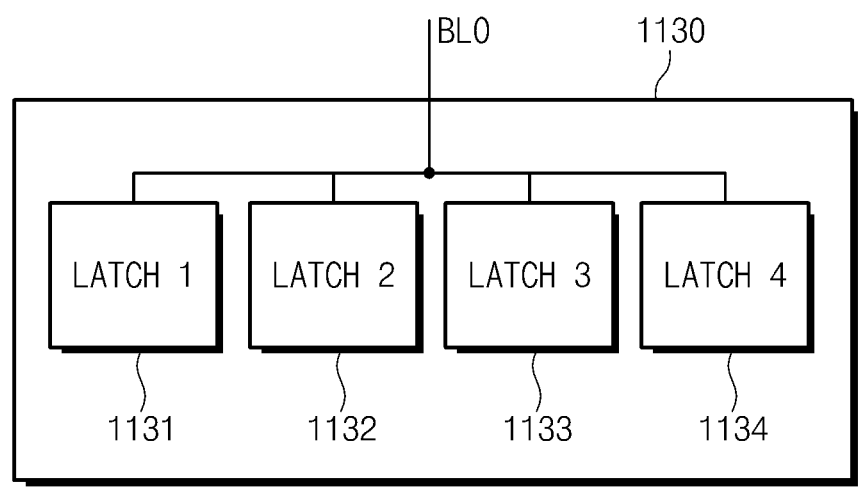
FIG. 6 is a block diagram schematically illustrating an example of a page buffer circuit of FIG. 5.

FIG. 6 is a block diagram schematically illustrating a page buffer circuit of FIG. 5. Referring to FIG. 6, a page buffer connected with one bit line (e.g., BL0) (or, connected with two or more bit lines) may include at least one or more latches 1131, 1132, 1133, and 1134. In FIG. 6, there is illustrated an example in which a page buffer includes four latches 1131, 1132, 1133, and 1134. However, the inventive concept is not limited thereto. The four latches 1131, 1132, 1133, and 1134 may be electrically connected.

A first latch 1131 may be a sense latch for sensing data of a memory cell. At an MLC program operation, second and third latches 1132 and 1133 may be a first data latch for storing a particular data bit and a second data latch for storing another particular data bit. A fourth latch 1134 may be a latch for storing input data or output data.

A page buffer circuit 1130 may perform a logical operation (e.g., an XNOR or XOR operation) on data of the four latches 1131, 1132, 1133, and 1134 according to a control of control logic 1160. For example, as illustrated in FIG. 3, it is assumed that a first soft decision value 2-2 is stored at the first data latch 1132 and a second soft decision value 2-3 is stored at the second data latch 1133. Under a control of the control logic 1160, the page buffer circuit 1130 may perform an XNOR operation on values stored at the first and second data latches 1132 and 1133 to generate soft decision data 2-4.

Figure 7:
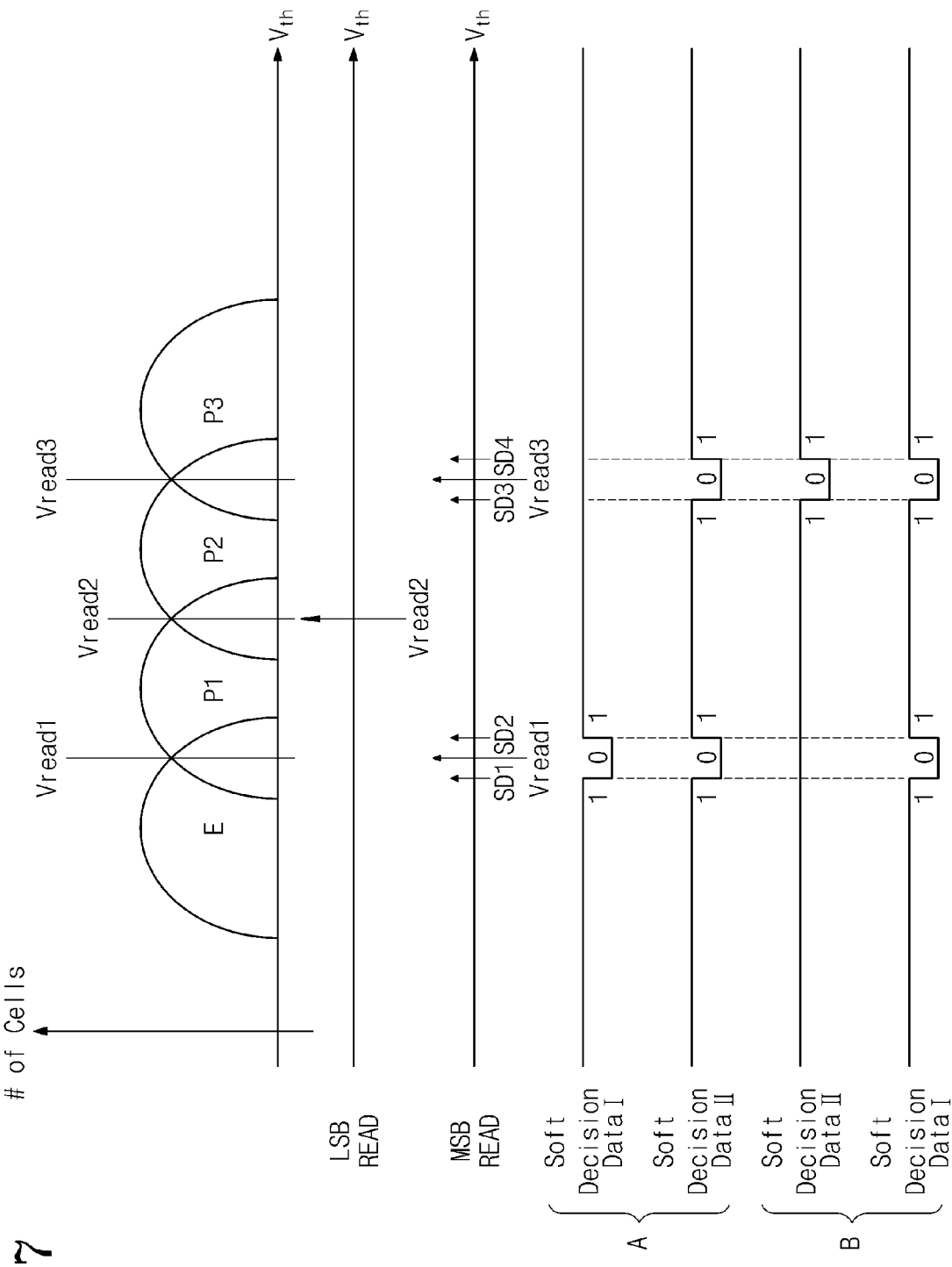
FIG. 7 is a conceptual diagram illustrating hard decision and soft decision read operations of a 2-bit MLC non-volatile memory device according to an embodiment of the inventive concept.

FIG. 7 is a conceptual diagram illustrating examples of hard decision and soft decision read operations of a 2-bit MLC non-volatile memory device according to an embodiment of the inventive concept. In FIG. 7, a horizontal axis may indicate a threshold voltage and a vertical axis may indicate the number of memory cells. Also, there may be illustrated an LSB read operation and an MSB read operation as hard decision read operations.

Referring to FIG. 7, a 2-bit MLC non-volatile memory device may have four program states E, P1, P2, and P3. At an LSB read operation, a hard decision read operation may be performed using a read voltage Vread2. Hard decision data may be formed through the hard decision read operation. The hard decision data may be provided to a memory controller 1200 (refer to FIG. 4) for ECC decoding.

At an MSB read operation, first and second hard decision data may be formed by performing first and second hard decision read operations using a first hard decision read voltage Vread1 and a second hard decision read voltage Vread3 which is higher than the first hard decision read voltage Vread1.

A non-volatile memory device 1100 (refer to FIG. 4) may select one of the first hard decision read voltage Vread1 and the second hard decision read voltage Vread3. The selection of the first or second hard decision read voltages Vread1 and Vread3 is not limited. For example, particular hard decision read voltage may be selected based on the number of read cycles or the number of program/erase cycles. As another example, a particular hard decision read voltage may be selected based on an error bit state of the first and second hard decision data. For example, a hard decision read voltage of data may be selected based on a bit error ratio of first and second hard decision read data.

For example, a hard decision read voltage Vread1 between an erase state E and a first program state P1 may be selected as a soft decision target voltage because a relatively large number of error bits exist. Also, the hard decision read voltage Vread1 may be selected based on a program/erase cycle.

Referring to a step A of FIG. 7, if the first hard decision read voltage Vread1 is selected, first soft decision data may be formed using a first soft decision read voltage SD1 which lower than the first hard decision read voltage Vread1 and a second soft decision read voltage SD2 which is higher than the first hard decision read voltage Vread1.

Referring to FIG. 7, memory cells having threshold voltages lower than the first soft decision read voltage SD1 may have first soft decision data "1", and memory cells having threshold voltages higher than the second soft decision read voltage SD2 may also have first soft decision data "1". Memory cells having threshold voltages higher than the first soft decision read voltage SD1 and lower than the second soft decision read voltage SD2 may have first soft decision data "0". The first soft decision data may be provided to the memory controller 1200 for first ECC decoding.

The first soft decision read operation may be performed when a result of the ECC decoding of MSB hard decision data is a fail. Alternatively, the first soft decision read operation may be performed regardless of whether the result of ECC decoding of hard decision data is a fail.

In a case where a result of the ECC decoding of first soft decision data is a fail, second soft decision data may be formed by performing a soft decision read operation using a third soft decision read voltage SD3 which is lower than a second hard decision read voltage Vread3 and a fourth soft decision read voltage SD4 which is higher than the second hard decision read voltage Vread3. The second soft decision data may be provided to the memory controller 1200 for second ECC decoding. In this case, as illustrated in FIG. 7, the first soft decision data and the second soft decision data may be provided to the memory controller 1200.

Alternatively, during execution of the first ECC decoding, the second soft decision data may be formed by performing a second soft decision read operation using the soft decision read voltages SD3 and SD4 associated with the second hard decision read voltage Vread3. When the first ECC decoding is failed, the second soft decision data may be provided to the memory controller 1200 for second ECC decoding. In this case, as illustrated in FIG. 7, the first soft decision data and the second soft decision data may be provided to the memory controller 1200. Also, if the first ECC decoding is successful, the second soft decision read operation may be interrupted.

Referring to a step B of FIG. 7, if the second hard decision read voltage Vread3 is selected, second soft decision data may be formed using the third soft decision read voltage SD3 which is lower than the second hard decision read voltage Vread3 and the fourth soft decision read voltage SD4 which is higher than the second hard decision read voltage Vread3. The second soft decision data may be provided to the memory controller 1200 for first ECC decoding.

The first soft decision read operation may be performed according to a soft decision read command when ECC decoding of MSB hard decision data is not successful (i.e., a fail result). Alternatively, the first soft decision read operation may be performed regardless of whether ECC decoding of hard decision data is not successful.

In a case where a result of ECC decoding of second soft decision data is a fail, first soft decision data may be formed by performing a soft decision read operation using the first soft decision read voltage SD1 which is lower than the first hard decision read voltage Vread1 and the second soft decision read voltage SD2 which is higher than the first hard decision read voltage Vread1. The first soft decision data may be provided to the memory controller 1200 for second ECC decoding. In this case, as illustrated in FIG. 7, the first soft decision data and the second soft decision data may be provided to the memory controller 1200.

Alternatively, during execution of the first ECC decoding, the first soft decision data may be formed by performing a soft decision read operation using the soft decision read voltages SD1 and SD2 associated with the first hard decision read voltage Vread1. When the first ECC decoding is not successful, the second soft decision data may be provided to the memory controller 1200 for second ECC decoding. In this case, as illustrated in FIG. 7, the first soft decision data and the second soft decision data may be provided to the memory controller 1200. Also, if the first ECC decoding is successful, the second soft decision read operation may be interrupted.

Figure 8:
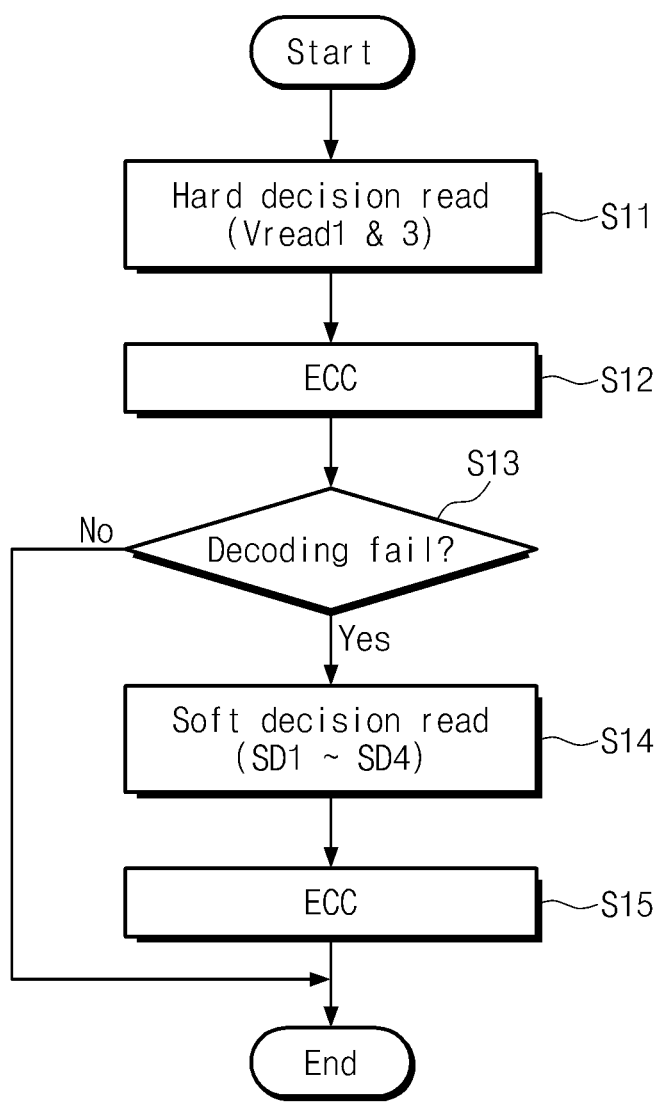
FIGS. 8 and 9 are flow charts illustrating an operating method of a memory system according to an embodiment of the inventive concept.
Figure 9:
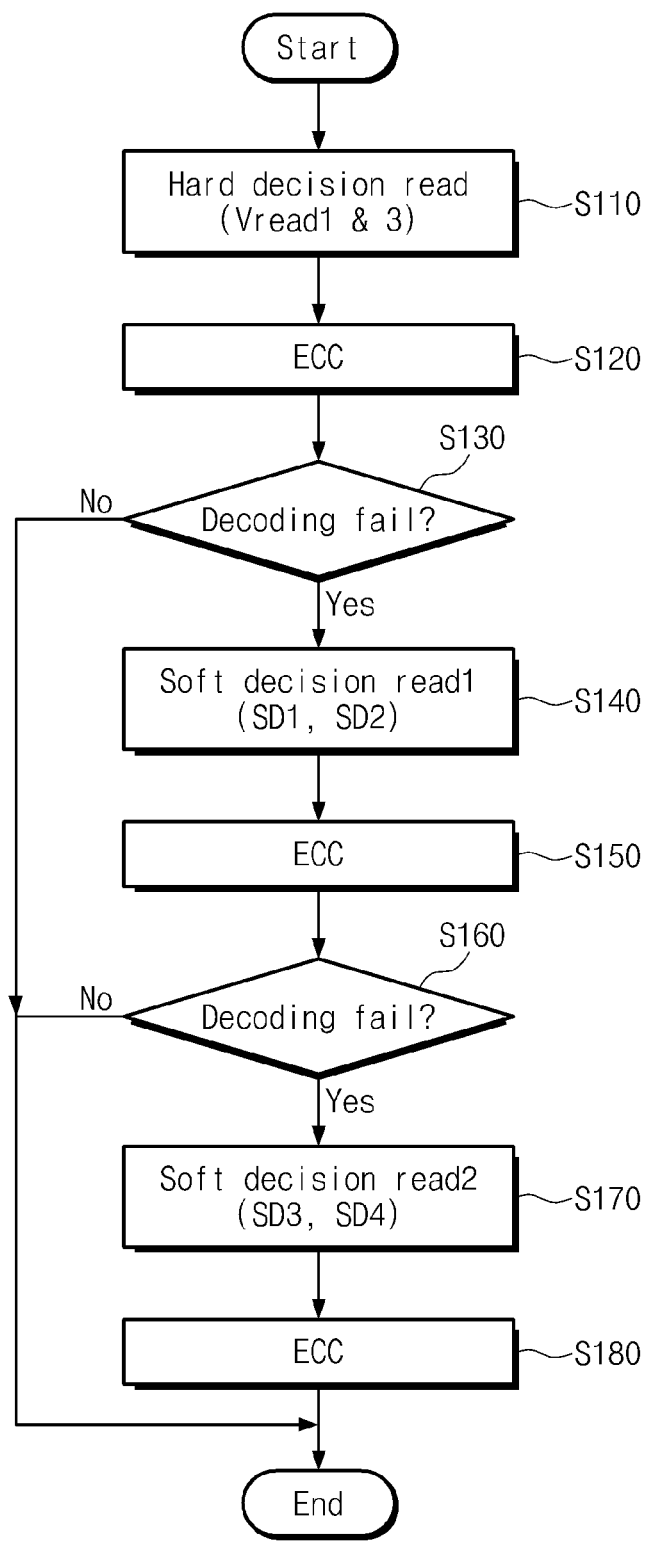

FIGS. 8 and 9 are flow charts illustrating an operating method of a memory system according to an embodiment of the inventive concept.

Referring to FIG. 8, at an MSB read operation, hard decision data may be formed by performing a hard decision read operation using a first hard decision voltage Vread1 and a second hard decision voltage Vread3 (S11). Error bit correction (ECC) may be performed using the hard decision data (S12). Whether an ECC decoding operation has failed may be determined (S13). If the ECC decoding operation has not failed, a read operation may be ended.

If the ECC decoding operation has failed, a first soft decision read operation may be performed using first and second soft decision read voltages SD1 and SD2, and a second soft decision read operation may be performed using third and fourth soft decision read voltages SD3 and SD4 (S14). The soft decision data may be provided to a memory controller 1200 for error bit correction (S15).

Referring to FIG. 9, a memory system 1000 (refer to FIG. 4) according to an embodiment of the inventive concept may operate in a manner different from that of FIG. 8.

In operation S110, hard decision data may be formed by preforming a hard decision read operation using first and second hard decision voltages Vread1 and Vread3 at an MSB read operation.

In operation S120, error bit correction may be performed using the hard decision data.

In operation S130, whether an ECC decoding operation on the hard decision data has failed may be determined. If the ECC decoding operation is successful, the read operation may be ended. If the ECC decoding operation has failed, the method may proceed to operation S140.

In operation S140, a first soft decision read operation may be performed. A non-volatile memory device 1100 may form first soft decision data by performing a first soft decision read operation using first and second soft decision read voltages SD1 and SD2.

In operation S150, first soft decision data may be provided to the memory controller 1200 for error bit correction.

In operation S160, whether an ECC decoding operation on the first soft decision data has failed may be determined. If the ECC decoding operation on the first soft decision data is successful, the method may be ended. If the ECC decoding operation on the first soft decision data has failed, the method may proceed to operation S170.

In operation S170, a second soft decision read operation may be performed. The non-volatile memory device 1100 may form second soft decision data by performing a second soft decision read operation using third and fourth soft decision read voltages SD3 and SD4.

In operation S180, second soft decision data may be provided to the memory controller 1200 for error bit correction. Here, the method may be ended.

During execution of ECC decoding, the memory system 1000 according to an embodiment of the inventive concept can perform the second soft decision read operation using the third and fourth soft decision read voltages SD3 and SD4. If an ECC decoding operation on the first soft decision data is successful, the second soft decision read operation may be interrupted.

Figure 10:
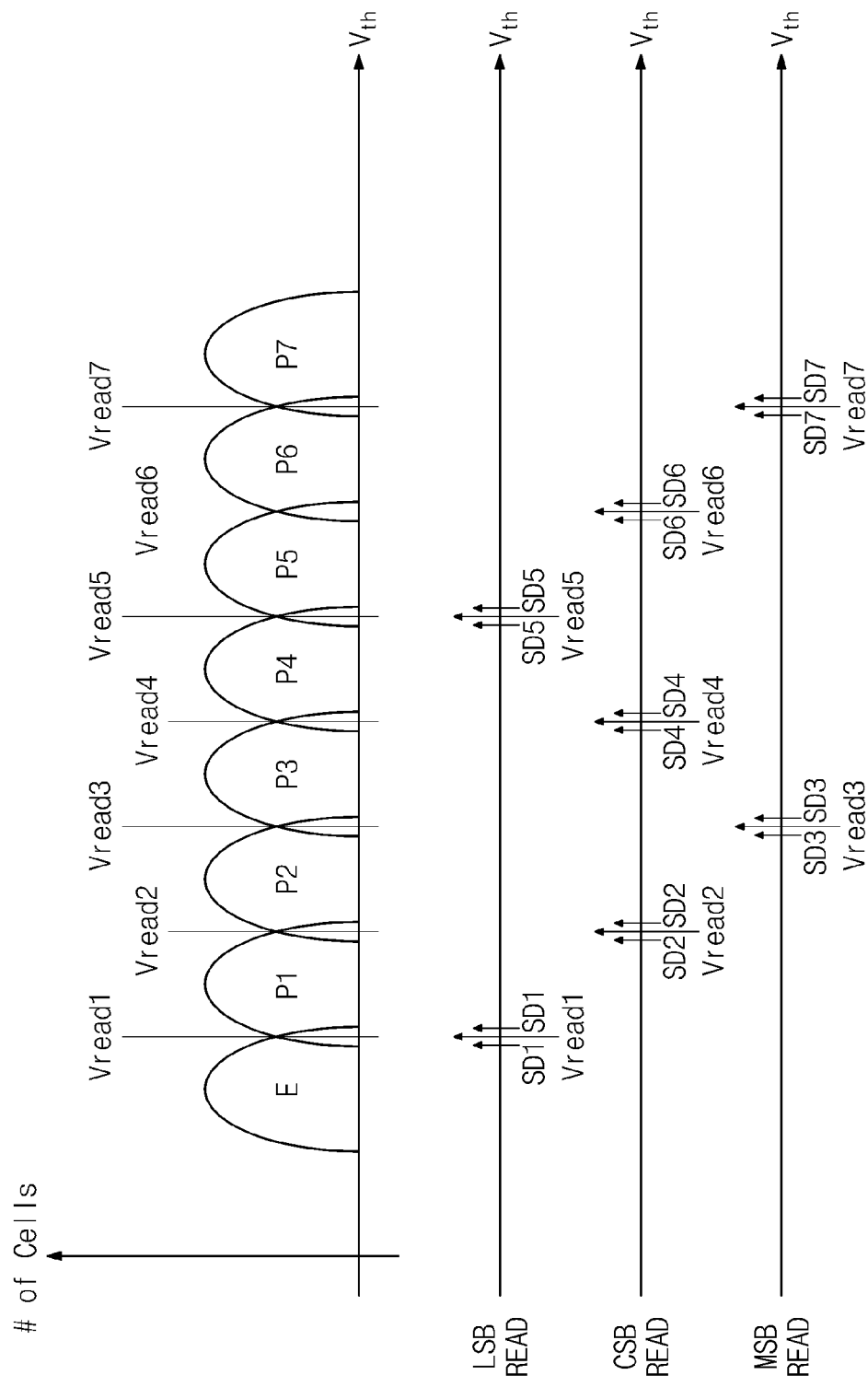
FIG. 10 is a conceptual diagram illustrating hard decision and soft decision read operations of a 3-bit MLC non-volatile memory device according to an embodiment of the inventive concept.

FIG. 10 is a conceptual diagram illustrating hard decision and soft decision read operations of a 3-bit MLC non-volatile memory device according to an embodiment of the inventive concept. In FIG. 10, a horizontal axis may indicate a threshold voltage and a vertical axis may indicate the number of memory cells. Also, there may be illustrated an LSB read operation, a CSB read operation, and an MSB read operation as hard decision read operations.

Referring to FIG. 10, a 2-bit MLC non-volatile memory device may have eight program states E, P1, P2, P3, P6, P5, P6, and P7. Seven hard decision read voltages Vread1, Vread2, Vread3, Vread4, Vread5, Vread6, and Vread7 may be used to distinguish data states.

At an LSB read operation, a hard decision read operation may be performed using a first hard decision read voltage Vread1 and a fifth hard decision read voltage Vread5 which is higher than the first hard decision read voltage Vread1. Hard decision data may be formed through the hard decision read operation. The hard decision data may be provided to a memory controller 1200 (refer to FIG. 4) for ECC decoding.

A non-volatile memory device 1100 (refer to FIG. 4) may select one of the first hard decision read voltage Vread1 and the fifth hard decision read voltage Vread5. As in the previous embodiments, the selection of a particular hard decision read voltage is not limited. As example, a particular hard decision read voltage may be selected based on the number of read cycles, the number of program/erase cycles, an error bit state of the first and fifth hard decision data, and/or a bit error ratio.

Alternatively, the hard decision read voltage Vread1 between the erase state E and the first program state P1 may be selected as a soft decision target voltage because a relatively large number error bits exist. If the hard decision read voltage Vread1 is selected, first soft decision data may be formed by performing a first soft decision read operation using a plurality of soft decision voltages SD1 having a voltage level which is different from that of the first hard decision read voltage Vread1. The first soft decision data may be provided to the memory controller 1200 for first ECC decoding.

The first soft decision read operation may be performed according to a soft decision read command when an ECC decoding operation on LSB hard decision data has failed. Alternatively, the first soft decision read operation may be performed regardless of whether an ECC decoding operation on LSB hard decision data has failed. In the case of a 3-bit MLC memory, a partial soft decision read operation can be performed by selecting a particular hard decision read voltage at the LSB read operation.

At the CSB read operation, second, fourth, and sixth hard decision data may be formed by performing second, fourth, and sixth hard decision read operations using second, fourth, and sixth hard decision read voltages Vread2, Vread4, and Vread6. Referring to FIG. 10, a hard decision read operation may be performed three times at the CSB read operation.

A non-volatile memory device 1100 may select one of the second, fourth, and sixth hard decision read voltages Vread2, Vread4, and Vread6. For example, if the second hard decision read voltage Vread2 is selected, the non-volatile memory device 1100 may form second soft decision data using a plurality of second soft decision read voltages SD2 having a voltage level which is different from that of the second hard decision read voltage Vread2.

A second soft decision read operation may be performed according to a soft decision read command when an ECC decoding operation on CSB hard decision data has failed. Alternatively, the second soft decision read operation may be performed regardless of an ECC decoding operation on hard decision data has failed.

If an ECC decoding operation on second soft decision data has failed, fourth soft decision data may be formed using a plurality of fourth soft decision read voltages SD4 having a voltage level which is different from that of a fourth hard decision read voltage Vread4, and an ECC decoding on the fourth soft decision data may be performed.

If an ECC decoding operation on the fourth soft decision data has failed, sixth soft decision data may be formed using a plurality of sixth soft decision read voltages SD6 having a voltage level which is different from that of a sixth hard decision read voltage Vread6. The sixth soft decision data may be provided to the memory controller 1200 for ECC decoding.

At the MSB read operation, third and sixth hard decision data may be formed by performing third and sixth hard decision read operations using a third hard decision read voltage Vread3 and a seventh hard decision read voltage Vread7 which are higher than the third hard decision read voltage Vread3.

The non-volatile memory device 1100 may select one of the third hard decision read voltage Vread3 and the seventh hard decision read voltage Vread7.

For example, if the third hard decision read voltage Vread3 is selected, the non-volatile memory device 1100 may form third soft decision data using a plurality of third soft decision read voltages SD3 having a voltage level which is different from that of the third hard decision read voltage Vread3. The third soft decision data may be provided to the memory controller 1200 for ECC decoding. A third soft decision read operation may be performed according to a soft decision read command when an ECC decoding operation on MSB hard decision data has failed. Alternatively, the third soft decision read operation may be performed regardless of an ECC decoding operation on hard decision data has failed.

If a result of ECC decoding operation is a fail, seventh soft decision data may be formed using a plurality of seventh soft decision read voltages SD7 having a voltage level which is different from that of a seventh hard decision read voltage Vread7, and may be provided to the memory controller 1200 for ECC decoding.

Figure 11:
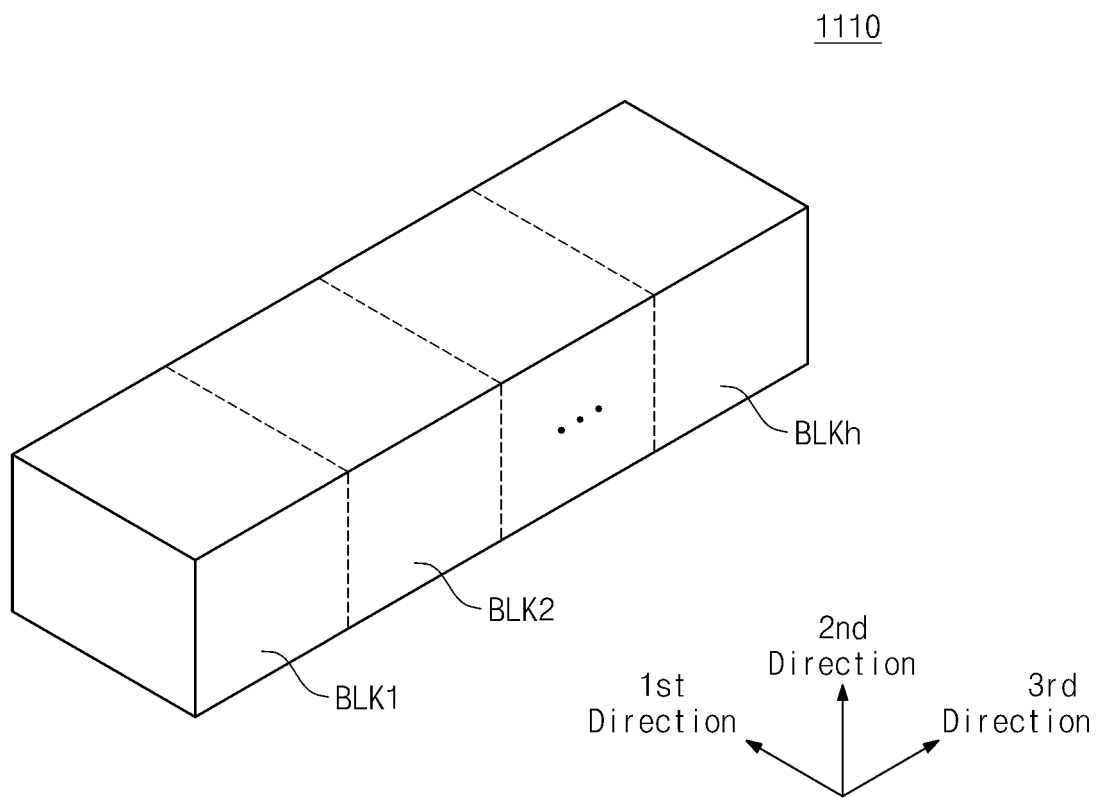
FIGS. 11, 12, 13, 14 and 15 are diagrams schematically illustrating a three-dimensional flash memory device according to embodiments of the inventive concept.

FIGS. 11 to 15 are diagrams schematically illustrating a three-dimensional flash memory device according to the inventive concept. FIG. 11 is a block diagram of the memory cell array 1110 of FIG. 4. Referring to FIG. 11, the memory cell array 1110 may include a plurality of memory blocks BLK1 to BLKh. Each of the memory blocks BLK1 to BLKh may have a three dimensional structure (or, a vertical structure). For example, each memory block may include structures extending along first to third directions.

Each memory block may include a plurality of NAND strings NS extending along the second direction. A plurality of NAND strings NS may be provided along the first and third directions. Each NAND string NS may be connected to a bit line BL, at least one string select line SSL, at least one ground select line GSL, a plurality of word lines WL, at least one dummy word line DWL, and a common source line CSL. Each of the memory blocks BLK1 to BLKh may be connected to a plurality of bit lines BL, a plurality of string select lines SSL, a plurality of ground select lines GSL, a plurality of word lines WL, a plurality of dummy word lines DWL, and a plurality of common source lines CSL. The memory blocks BLK1 to BLKh will be more fully described with reference to FIG. 12.

Figure 12:
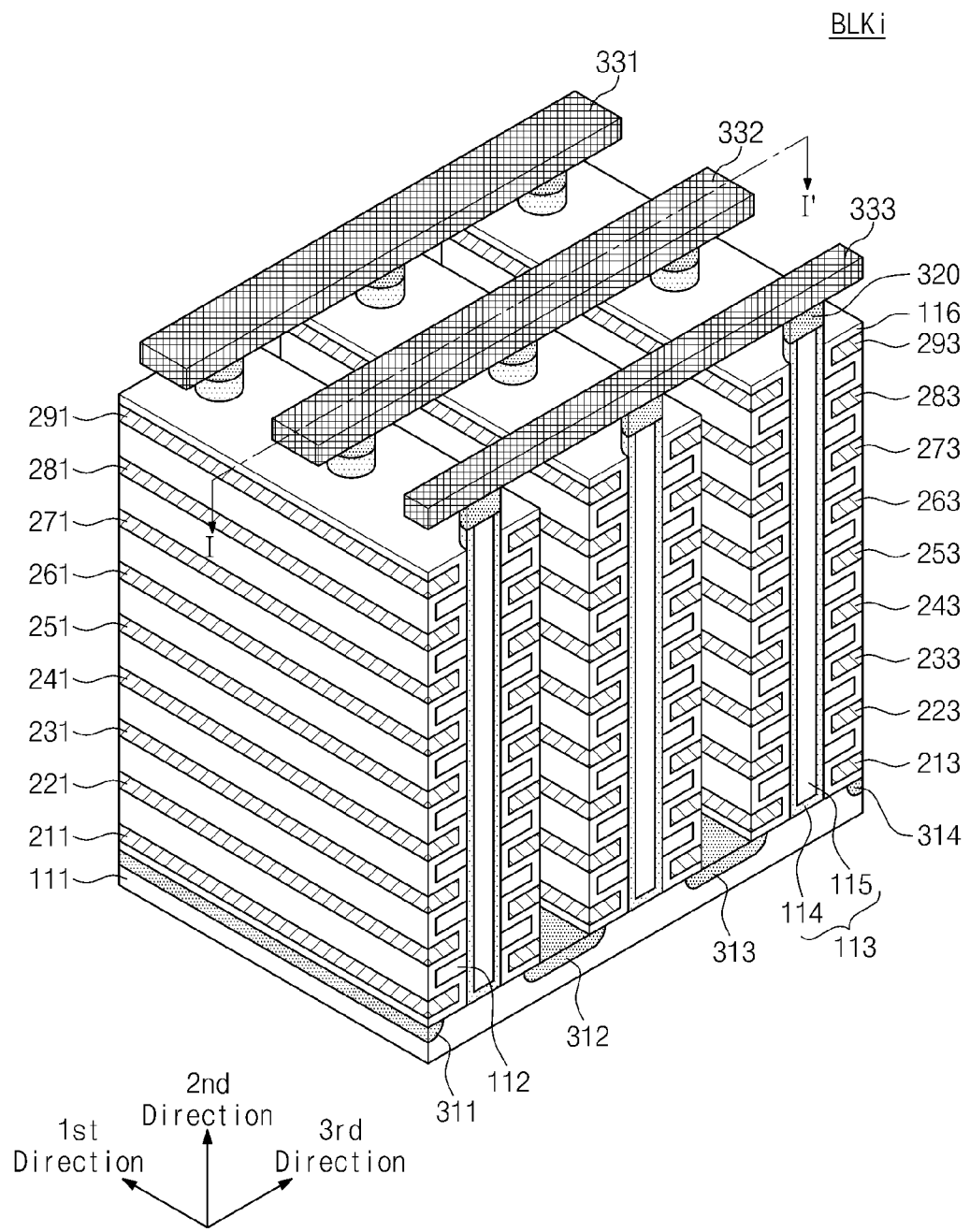
Figure 13:
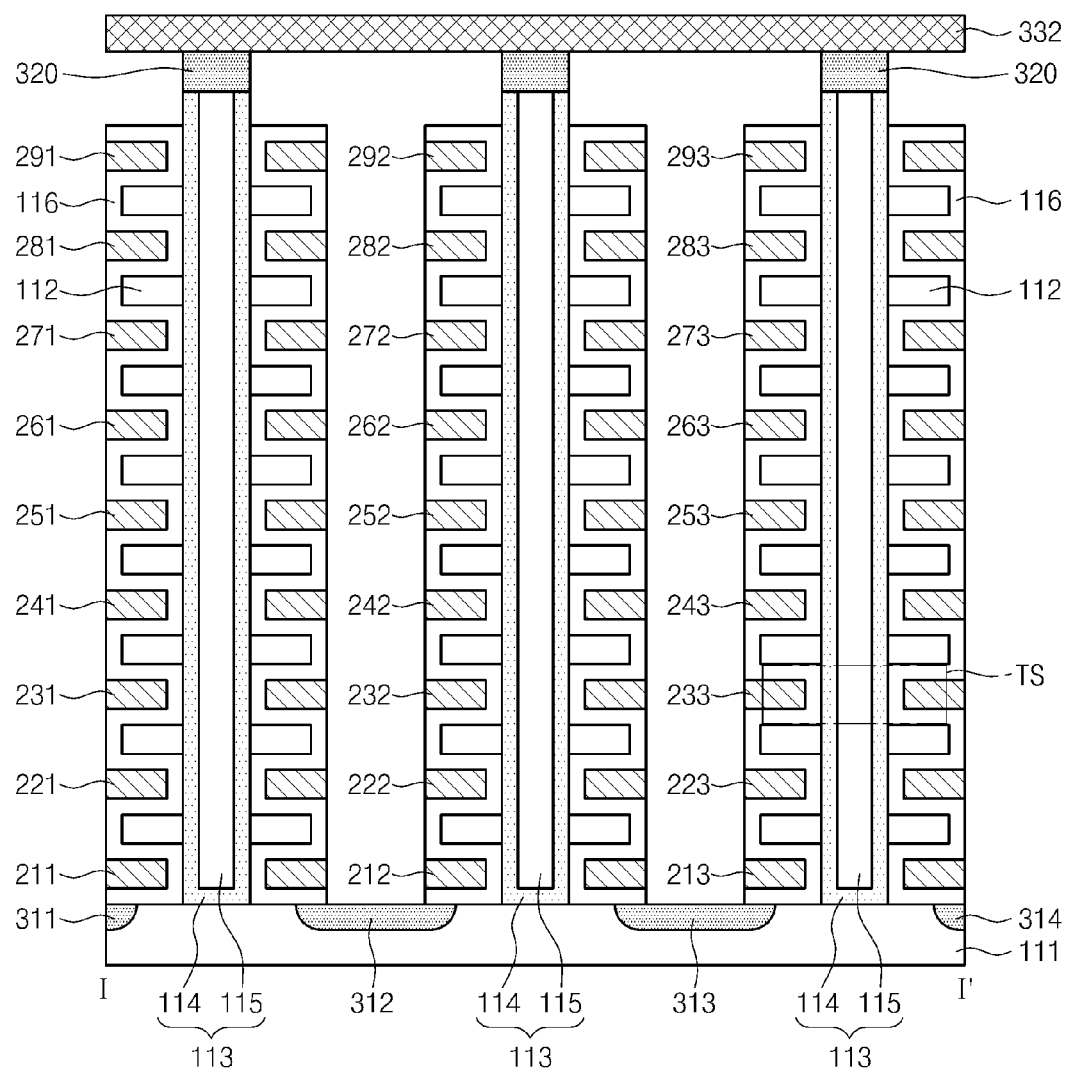

FIG. 12 is a perspective view of one memory block BLKi of FIG. 11. FIG. 13 is a cross-sectional view taken along a line I-I' of the memory block BLKi of FIG. 12. Referring to FIGS. 12 and 13, a memory block BLKi may include structures extending along first to third directions.

First, a substrate 111 may be provided. The substrate 111 may include a silicon material doped by first type impurity. For example, the substrate 111 may include a silicon material doped by p-type impurity or be a p-type well (e.g., a pocket p-well). The substrate 111 may further include an n-type well surrounding the p-type well. Below, it is assumed that the substrate 111 is p-type silicon. However, the substrate 111 is not limited to the p-type silicon. A plurality of doping regions 311 to 314 extending along the first direction may be provided on the substrate 111. For example, the plurality of doping regions 311 to 314 may have a second type differing from that of the substrate 111. For example, the plurality of doping regions 311 to 314 may be n-type. Below, it is assumed that the first to fourth doping regions 311 to 314 are n-type. However, the first to fourth doping regions 311 to 314 are not limited to the n-type. A plurality of insulation materials 112 extending along the first direction may be sequentially provided along the second direction over a region of the substrate 111 between the first and second doping regions 311 and 312. For example, the plurality of insulation materials 112 may be provided along the second direction such that they are spaced apart by a predetermined or desired distance. For example, the plurality of insulation materials 112 may be provided to be spaced apart from each other along the second direction. The insulation materials 112 may include an insulator such as silicon oxide.

A plurality of pillars 113 may be sequentially provided on a region of the substrate 111 between the first doping region 311 and the second doping region 312, and may be formed to penetrate the insulation materials 112 along the second direction. Exemplarily, the plurality of pillars 113 may penetrate the insulation materials 112 to contact with the substrate 111.

Each of the pillars 113 may be composed of a plurality of materials. For instance, a surface layer 114 of each pillar 113 may include a silicon material having a first type. For example, the surface layer 114 of each pillar 113 may include a silicon material which is doped with the same type as that of the substrate 111. Hereinafter, it is assumed that the surface layer 114 of each pillar 113 includes p-type silicon. However, the surface layer 114 of each pillar 113 is not limited to include p-type silicon.

An inner layer 115 of each pillar 113 may be formed of an insulation material. For example, the inner layer 115 of each pillar 113 may be filled with an insulation material such as silicon oxide.

In a region between the first and second doping regions 311 and 312, an insulation layer 116 may be provided along exposed surfaces of the insulation materials 112, the pillars 113, and the substrate 111. Exemplarily, the thickness of the insulation material 116 may be less than a half of the distance between the insulation materials 112. That is, a region, in which any material other than the insulation materials 112 and the insulation layer 116 is disposed, may be provided between the insulation layer 116 provided on an undersurface of the first insulation material of the insulation materials 112 and the insulation layer 116 provided on a top surface of the second insulation material under the first insulation material.

In the region between the first and second doping regions 311 and 312, conductive materials 211 to 291 may be provided on an exposed surface of the insulation layer 116. For example, the conductive material 211 extending along the first direction may be provided between the substrate 111 and the insulation layer 112 adjacent thereto. More specifically, the conductive material 211 extending along the first direction may be provided between the substrate 111 and the insulation layer 116 disposed under the insulation material 112 adjacent to the substrate 111. A conductive material extending along the first direction may be provided between the insulation layer 116 on a top surface of a specific insulation material among the insulation materials 112 and the insulation layer 116 disposed on an undersurface of an insulation layer provided on top of the specific insulation material. Exemplarily, a plurality of conductive materials 221 to 281 extending along the first direction may be provided between the insulation materials 112. Also, the conductive material 291 extending along the first direction may be provided on the insulation materials 112. Exemplarily, the conductive materials 211 to 291 extending along the first direction may be a metallic material. Exemplarily, the conductive materials 211 to 291 extending along the first direction may be a conductive material such as polysilicon.

A structure identical to a structure disposed on the first and second doping regions 311 and 312 may be provided in a region between the second and third doping regions 312 and 313. Exemplarily, the plurality of insulation materials 112 extending along the first direction, the plurality of pillars 113 which are sequentially arranged in the first direction and penetrate the plurality of insulation materials 113 in the third direction, the insulation layer 116 provided on exposed surfaces of the plurality of insulation materials 112 and the plurality of pillars 112, and the plurality of conductive materials 212 to 292 extending along the first direction may be provided in the region between the second and third doping regions 312 and 313.

A structure identical to a structure disposed on the first and second doping regions 311 and 312 may be provided in a region between the third and fourth doping regions 313 and 314. Exemplarily, the plurality of insulation materials 112 extending along the first direction, the plurality of pillars 113 which are sequentially arranged in the first direction and penetrate the plurality of insulation materials 113 in the third direction, the insulation layer 116 provided on exposed surfaces of the plurality of insulation materials 112 and the plurality of pillars 112, and the plurality of conductive materials 213 to 293 extending along the first direction may be provided in the region between the third and fourth doping regions 313 and 314.

Drains 320 may be respectively provided on the plurality of pillars 113. Exemplarily, the drains 320 may include a silicon material doped with a second type material. For example, the drains 320 may include a silicon material doped with an n-type material. Hereinafter, it is assumed that the drains 320 include a silicon material doped with an n-type material. However, the drains 320 are not limited to include n-type silicon materials. In example embodiments, a width of each drain 320 may be wider than that of a corresponding pillar 113. For example, each drain 320 may be provided on a top surface of the corresponding pillar 113 in a pad shape.

Conductive materials 331 to 333 extending in the third direction may be respectively connected on the drains 320. The conductive materials 331 to 333 may be sequentially disposed along the first direction. The conductive materials 331 to 333 may be respectively connected to the drains 320 in the corresponding region. Exemplarily, the drains 320 and the second conductive material 333 extending along the third direction may be connected to each other through respective contact plugs. Exemplarily, the conductive materials 331 to 333 extending along the third direction may be a metallic material. Exemplarily, the conductive materials 331 to 333 may be a conductive material such as polysilicon.

In FIGS. 12 and 13, each of the pillars 113 may form a string together with an adjacent region of the insulation layer 116 and an adjacent region of the plurality of conductive materials 211 to 291, 212 to 292, and 213 to 293. For example, each pillar 113 may form a NAND string NS together with an adjacent region to the insulation layer 116 and an adjacent region of the first conductive materials 211 to 291, 212 to 292, and 213 to 293 extending along the first direction. The NAND string NS may include a plurality of transistor structures TS. The transistor structure TS will be more fully described with reference to FIG. 14.

Figure 14:
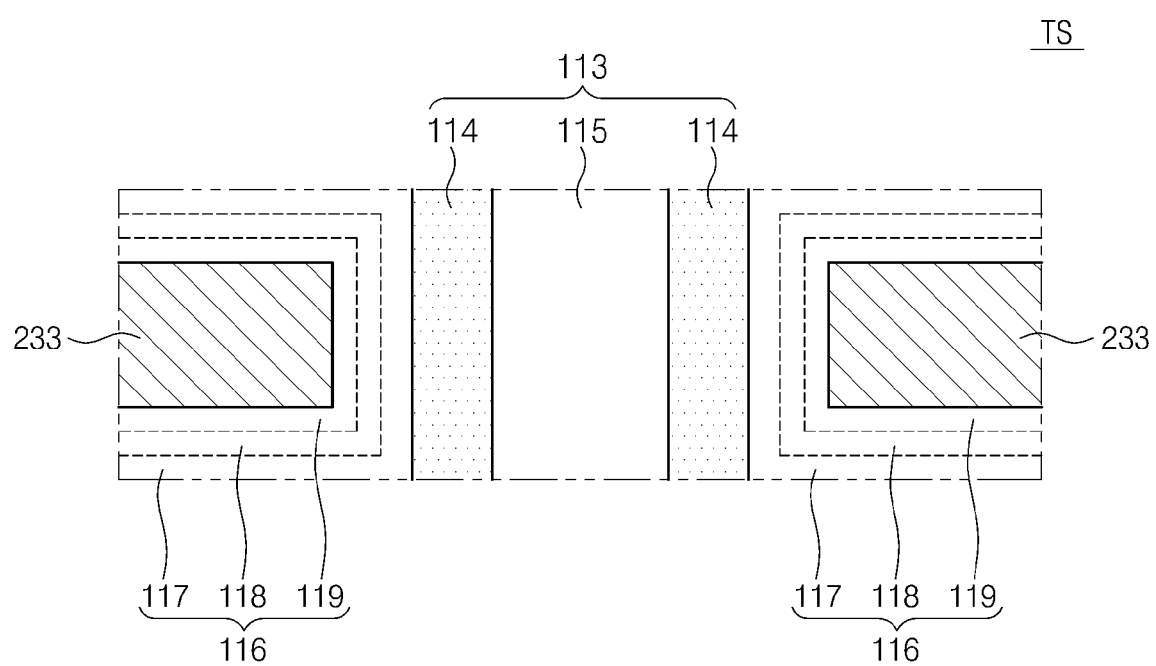

FIG. 14 is a cross-sectional view of a transistor structure TS of FIG. 13. Referring to FIGS. 12 to 14, an insulation layer 116 may include first to third sub insulation layers 117, 118 and 119.

P-type silicon 114 of a pillar 113 may act as a body. The first sub insulation layer 117 adjacent to the pillar 113 may act as a tunneling insulation layer. For example, the first sub insulation layer 117 adjacent to the pillar 113 may include a thermal oxide layer.

The second sub insulation layer 118 may act as a charge storage layer. For example, the second sub insulation layer 118 may act as a charge trap layer. For example, the second sub insulation layer 118 may include a nitride layer or a metal oxide layer (e.g., aluminum oxide layer, hafnium oxide layer, etc.).

The third sub insulation layer 119 adjacent to a conductive material 233 may act as a blocking insulation layer. Exemplarily, the third sub insulation layer 119 adjacent to a conductive material 133 extending along a first direction may have a mono-layered or multi-layered structure. The third sub insulation layer 119 may be a high dielectric layer (e.g., aluminum oxide layer, hafnium oxide layer, etc.) having a higher dielectric constant than the first and second sub insulation layers 117 and 118.

The conductive material 233 may act as a gate (or control gate). That is, the gate (or control gate) 233, the blocking insulation layer 119, the charge trap layer 118, the tunneling insulation layer 117, and the body 114 may form a transistor (or memory cell transistor structure). Exemplarily, the first to third sub insulation layers 117 to 119 may form an ONO structure (oxide-nitride-oxide). Hereinafter, the p-type silicon 114 of the pillar 113 may be defined to act as the body in the second direction.

The memory block BLKi may include a plurality of pillars 113. That is, the memory block BLKi may include a plurality of NAND strings NS. More specifically, the memory block BLKi may include a plurality of NAND strings NS extending along a second direction (or, a direction perpendicular to a substrate).

Each of the NAND strings NS may include a plurality of transistor structures TS which are stacked in a second direction. At least one of the plurality of transistor structures TS of each NAND string NS may act as a string select transistor SST. At least one of the plurality of transistor structures TS of each NAND string may act as a ground select transistor GST.

The gates (or control gates) may correspond to the conductive materials 211 to 291, 212 to 292, and 213 to 293 extending along the first direction. That is, the gates (or control gates) may form word lines WL extending along the first direction and at least two select lines (e.g., at least one string select line SSL and at least one ground select line GSL).

The conductive materials 331 to 333 extending along the third direction may be connected to one ends of the NAND strings NS. For example, the conductive materials 331 to 333 extending along the third direction may act as bit lines BL. That is, in one memory block BLKi, one bit line BL may be connected to the plurality of NAND strings.

The second type doping regions 311 to 314 extending along the first direction may be provided at the other ends of the NAND strings NS. The second type doping regions 311 to 314 extending along the first direction may act as common source lines CSL.

In summary, the memory block BLKi may include the plurality of NAND strings NS extending along a direction (second direction) perpendicular to the substrate 111, and may operate as a NAND flash memory block (e.g., charge trap type) in which the plurality of NAND strings NS is connected to one bit line BL.

In FIGS. 12 to 14, it has been described that the conductive materials 211 to 291, 212 to 292, and 213 to 293 extending along the first direction are provided on nine layers. However, the first conductive materials 211 to 291, 212 to 292, and 213 to 293 extending along the first direction are not limited to being provided on the nine layers. For example, the conductive materials extending along the first direction may be provided upon 8, 16 or more layers. That is, a NAND string may include 8, 16 or more transistors.

In FIGS. 12 to 14, it has been described that three NAND strings NS are connected to one bit line BL. However, the inventive concept is not limited to such a case that three NAND strings NS are connected to one bit line BL. Exemplarily, in the memory block BLKi, m NAND strings NS may be connected to one bit line BL. Here, the number of the conductive materials 211 to 291, 212 to 292, and 213 to 293 extending along the first direction and the number of common source lines 311 to 314 may also be adjusted so as to correspond to the number of NAND strings NS connected to one bit line BL.

In FIGS. 12 to 14, it has been described that three NAND strings NS are connected to one conductive material extending along the first direction. However, the inventive concept is not limited to such a case that three NAND strings NS are connected to a conductive material. For example, n NAND strings NS may be connected to one conductive material. Here, the number of the conductive materials 331 to 333 extending along the third direction may also be adjusted to correspond to the number of NAND strings NS connected to one conductive material.

Figure 15:
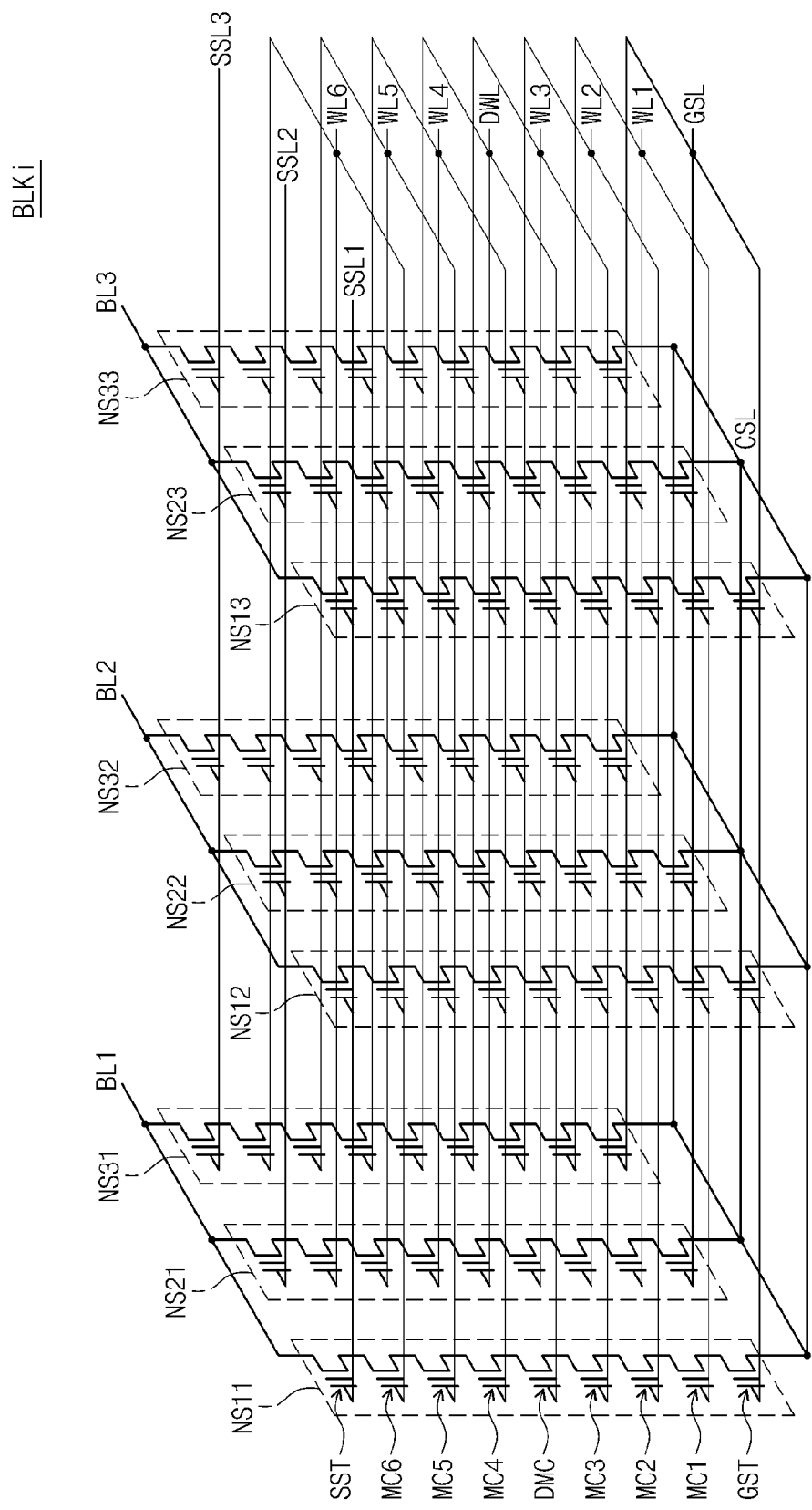

FIG. 15 is an equivalent diagram of a memory block BLKi described with reference to FIGS. 12 to 14. Referring to FIGS. 12 to 15, NAND strings NS11 to NS31 may be provided between a first bit line BL1 and a common source line CSL. NAND strings NS12, NS22 and NS32 may be provided between a second bit line BL2 and the common source line CSL. NAND strings NS13, NS23 and NS33 may be provided between a third bit line BL3 and the common source line CSL. The third bit line BL3 may correspond to a conductive material 333 extending along a third direction.

A string select transistor SST of each NAND string NS may be connected to a corresponding bit line BL. A ground select transistor GST of each NAND string NS may be connected to the common source line CSL. Memory cells MC may be provided between the string select transistor SST and the ground select transistor GST of each NAND string NS.

Hereinafter, the NAND strings NS may be defined in units of rows and columns. The NAND strings NS commonly connected to one bit line may form one column. For example, the NAND strings NS11 to NS 31 connected to the first bit line BL1 may correspond to a first column. The NAND strings NS12 to NS 32 connected to the second bit line BL2 may correspond to a second column. The NAND strings NS13 to NS 33 connected to the third bit line BL3 may correspond to a third column. The NAND strings NS connected to one string select line SSL may form one row. For example, the NAND strings NS11 to NS13 connected to a first string select line SSL1 may form a first row. The NAND strings NS21 to NS23 connected to a second string select line SSL2 may form a second row. The NAND strings NS31 to NS33 connected to a third string select line SSL3 may form a third row.

A height may be defined in each NAND string NS. Exemplarily, the height of the ground select transistor GST may be defined as 1 in each NAND string NS. In each NAND string NS, the closer to the string selection transistor SST, the higher the height of a memory cell. In each NAND string NS, the height of the memory cell MC6 adjacent to the string select transistor SST may be defined as 6.

The string select transistors SST of the NAND strings NS of the same row may share the string select line SSL. The string select transistors SST of the NAND strings NS in different rows may be connected with different string select lines SSL1, SSL2, and SSL3, respectively.

The memory cells MC having the same height in the NAND strings NS of the same row may share the word line WL. The word lines WL of the NAND strings NS which have the same height and correspond to different rows may be commonly connected. Dummy memory cells DMC having the same height in the NAND strings NS of the same row may share a dummy word line DWL. The dummy word lines DWL of the NAND strings NS which have the same height and are connected to dummy memory cells DMC of the NAND strings NS in different rows may be commonly connected.

Exemplarily, the word lines WL or the dummy word lines DWL may be commonly connected on layers where conductive materials 211 to 291, 212 to 292, and 213 to 293 extending in the first direction are provided.

Exemplarily, the conductive materials 211 to 291, 212 to 292, and 213 to 293 extending in the first direction may be connected to an upper layer via a contact. The conductive materials 211 to 291, 212 to 292, and 213 to 293 extending in the first direction may be connected in common at the upper layer. Ground select transistors GST of the NAND strings NS of the same row may share a ground select line GSL. The ground select transistors GST of the NAND strings NS in different rows may share the ground select line GSL. That is, the NAND strings NS11 to NS13, NS21 to NS23, and NS31 to NS33 may be connected in common to the ground select line GSL.

The common source line CSL may be commonly connected to all the NAND strings NS. For example, the first to fourth doping regions 311 to 314 may be connected at an active region of the substrate 111. For example, the first to fourth doping regions 311 to 314 may be connected to an upper layer via a contact. The first to fourth doping regions 311 to 314 may be connected in common at the upper layer.

As illustrated in FIG. 15, the word lines WL having the same height may be commonly connected. Therefore, when the word line WL with a specific height is selected, all of the NAND strings NS connected to the selected word line WL may be selected. The NAND strings NS of different rows may be connected to different string select lines SSL. Accordingly, among the NAND strings NS connected to the same word line WL, the NAND strings NS of the unselected row may be electrically isolated from the bit lines BL1 to BL3. That is, a row of the NAND strings NS may be selected by selecting the string select lines SSL1 to SSL3. The NAND strings NS of the selected row may be selected by the column unit by selecting the bit lines BL1 to BL3.

In each NAND string NS, a dummy memory cell DMC may be provided. The first to third memory cells MC1 to MC3 may be provided between the dummy memory cell DMC and the ground select transistor GST. The fourth to sixth memory cells MC4 to MC6 may be provided between the dummy memory cell DMC and the string select transistor SST. Below, it is assumed that the memory cells MC in each NAND string NS are divided into memory cell groups by the dummy memory cell DMC. Memory cells (e.g., MC1 to MC3), adjacent to the ground select transistor GST, from among the divided memory cell groups may be referred to as a lower memory cell group. Memory cells (e.g., MC4 to MC6), adjacent to the string select transistor SST, from among the divided memory cell groups may be referred to as an upper memory cell group.

An operating method of a non-volatile memory device which includes at least one or more cell strings each arranged in a direction perpendicular to a substrate connected with a memory controller and including memory cells, a string select transistor and a ground select transistor will be described with reference to FIGS. 11 to 15. With the operating method, the non-volatile memory device may be provided with a first read command to perform first and second hard decision read operations using a first hard decision read voltage and a second hard decision read voltage which is higher than a first read voltage, form hard decision data, select a particular one of the first and second hard decision voltages based on an error bit state of the hard decision data, form soft decision data using a third and/or four read voltage which is higher or lower by a predetermined voltage than a hard decision read voltage of selected data, and provide the soft decision data to the memory controller.

Figure 16:
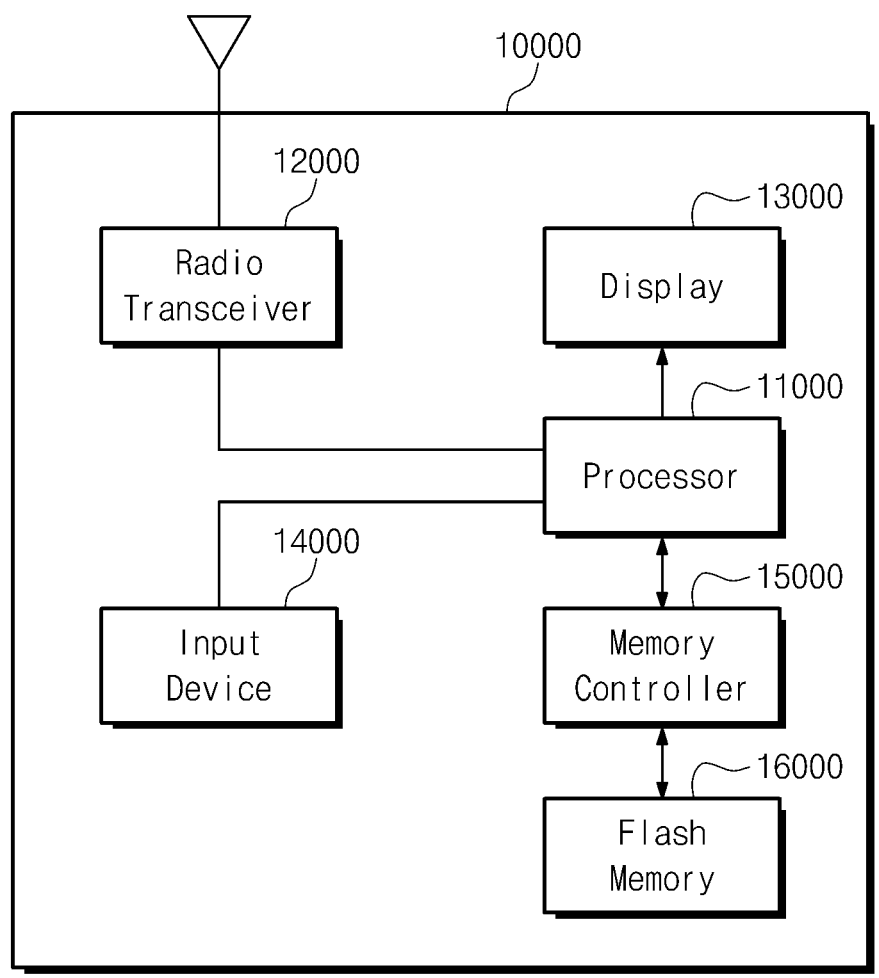
FIG. 16 is a block diagram schematically illustrating an electronic device including a memory controller and a non-volatile memory device according to an embodiment of the inventive concept.

FIG. 16 is a block diagram schematically illustrating an electronic device 10000 including a memory controller 15000 and a non-volatile memory device 16000 according to an embodiment of the inventive concept.

Referring to FIG. 16, an electronic device 10000 such as a cellular phone, a smart phone, or a tablet PC may include a non-volatile memory device 16000 implemented by a flash memory device and a memory controller 15000 to control the non-volatile memory device 16000.

The non-volatile memory device 16000 may mean a non-volatile memory device as described above in connection with in FIGS. 1 to 15. The non-volatile memory device 16000 may store random data.

The memory controller 15000 may be controlled by a processor 11000 which controls an overall operation of the electronic device 10000.

Data stored at the non-volatile memory device 16000 may be displayed through a display 13000 according to a control of the memory controller 15000 which operates according to a control of the processor 11000.

A radio transceiver 12000 may change a radio signal through an antenna. For example, the radio transceiver 12000 may convert a radio signal received through the antenna into a signal capable of being processed by the processor 11000. Thus, the processor 11000 may process a signal from the radio transceiver 12000, and may store the processed signal at the non-volatile memory device 16000. Or, the processor 11000 may display the processed signal through the display 13000.

The radio transceiver 12000 may convert a signal from the processor 11000 into a radio signal, and may output the converted radio signal to the exterior through the antenna.

An input device 14000 may be a device that receives a control signal for controlling an operation of the processor 11000 or data to be processed by the processor 11000, and may be implemented by a pointing device such as a touch pad or a computer mouse, a key pad, or a keyboard.

The processor 11000 may control the display 13000 such that data from the non-volatile memory device 16000, a radio signal from the radio transceiver 12000 or data from the input device 14000 is displayed through the display 13000.

Figure 17:
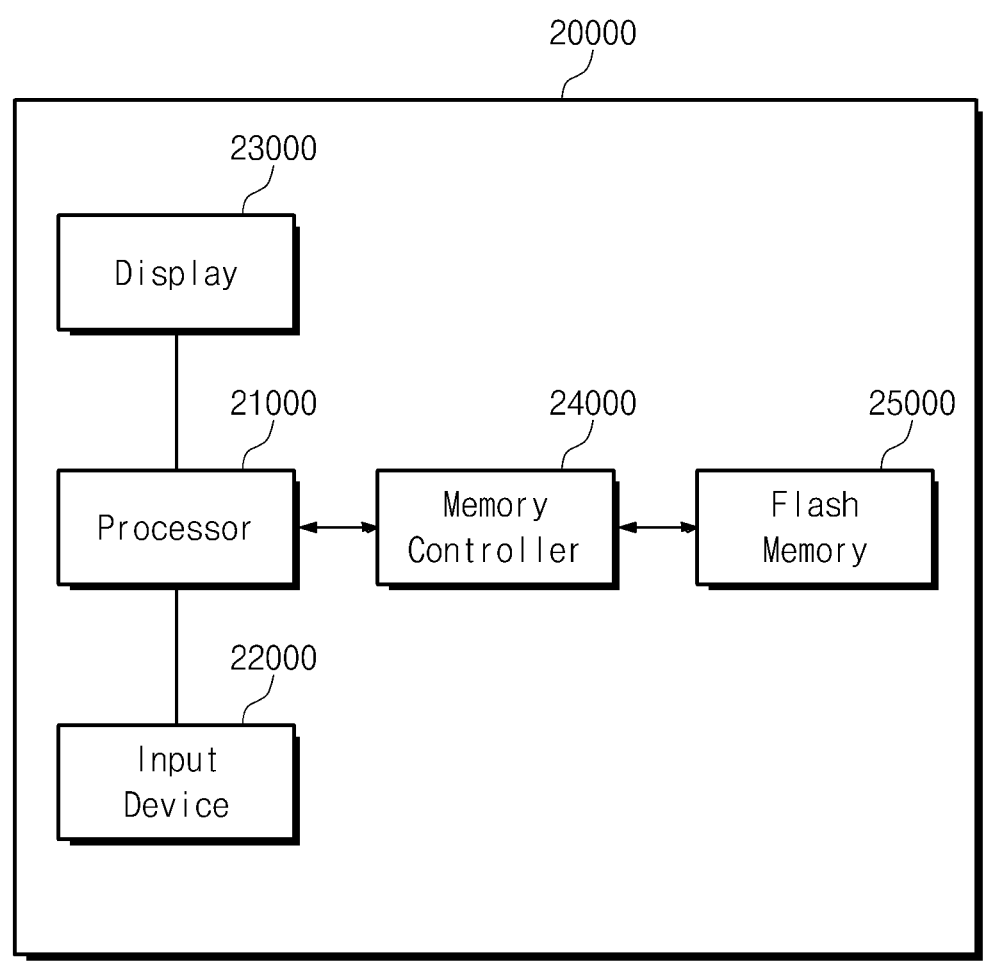
FIG. 17 is a block diagram schematically illustrating an electronic device including a memory controller and a non-volatile memory device according to another embodiment of the inventive concept.

FIG. 17 is a block diagram schematically illustrating an electronic device 20000 including a memory controller 24000 and a non-volatile memory device 25000 according to another embodiment of the inventive concept.

Referring to FIG. 17, an electronic device 20000 may be implemented by a data processing device such as a personal computer, a tablet computer, a net-book, an e-reader, a PDA (Personal Digital Assistant), a PMP (Portable Multimedia Player), an MP3 player, or an MP4 player, and may include a non-volatile memory device 25000 (e.g., a flash memory device) and a memory controller 24000 to control an operation of the non-volatile memory device 25000.

The non-volatile memory device 25000 may mean a non-volatile memory device as described previously in connection with FIGS. 1 to 15. The non-volatile memory device 25000 may store random data.

The electronic device 20000 may include a processor 21000 to control an overall operation of the electronic device 20000. The memory controller 24000 may be controlled by the processor 21000.

The processor 21000 may display data stored at the non-volatile memory device 25000 through a display 23000 according to an input signal generated by an input device 22000. For example, the input device 22000 may be implemented by a pointing device such as a touch pad or a computer mouse, a key pad, or a keyboard.

Figure 18:
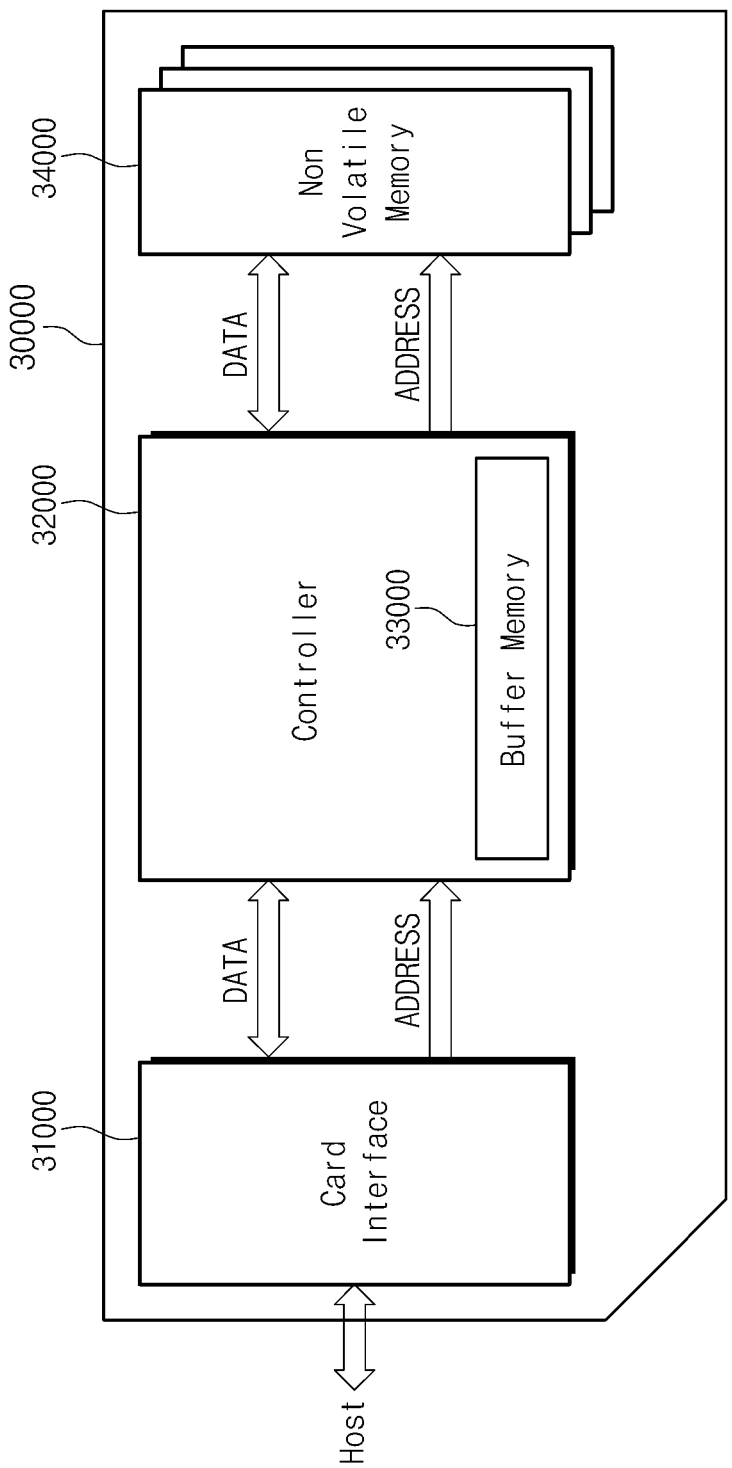
FIG. 18 is a block diagram schematically illustrating an electronic device including a non-volatile memory device according to still another embodiment of the inventive concept.

FIG. 18 is a block diagram schematically illustrating an electronic device 30000 including a non-volatile memory device 34000 according to still another embodiment of the inventive concept.

Referring to FIG. 18, an electronic device 30000 may include a card interface 31000, a memory controller 32000, and a non-volatile memory device 34000 (e.g., a flash memory device).

The electronic device 30000 may exchange data with a host through the card interface 31000. The card interface 31000 may be an SD (Secure Digital) card interface or an MMC (Multi-Media Card) interface. However, the inventive concept is not limited thereto. The card interface 31000 may interface data exchange between the host and the memory controller 32000 according to the communications protocol of the host capable of communicating the electronic device 30000.

The memory controller 32000 may control an overall operation of the electronic device 30000, and may control exchange of data between the card interface 31000 and the non-volatile memory device 34000. A buffer memory 33000 of the memory controller 32000 may buffer data transferred between the card interface 31000 and the non-volatile memory device 34000.

The memory controller 32000 may be connected with the card interface 31000 and the non-volatile memory device 34000 through a data bus DATA and an address bus ADDRESS. According to an embodiment, the memory controller 32000 may receive an address of data to be read or written from the card interface 31000 through the address bus ADDRESS, and may send it to the non-volatile memory device 34000.

Also, the memory controller 32000 may receive or transfer data to be read or written through the data bus DATA connected with the card interface 31000 or the non-volatile memory device 34000.

The non-volatile memory device 34000 may mean a non-volatile memory device as described previously in connection with FIGS. 1 to 15. The non-volatile memory device 34000 may store random data.

When the electronic device 30000 is connected with a host such as a PC, a tablet PC, a digital camera, a digital audio player, a mobile phone, console video game hardware or a digital set-top box, the host may exchange data stored at the non-volatile memory device 34000 through the card interface 31000 and the memory controller 32000.

Figure 19:
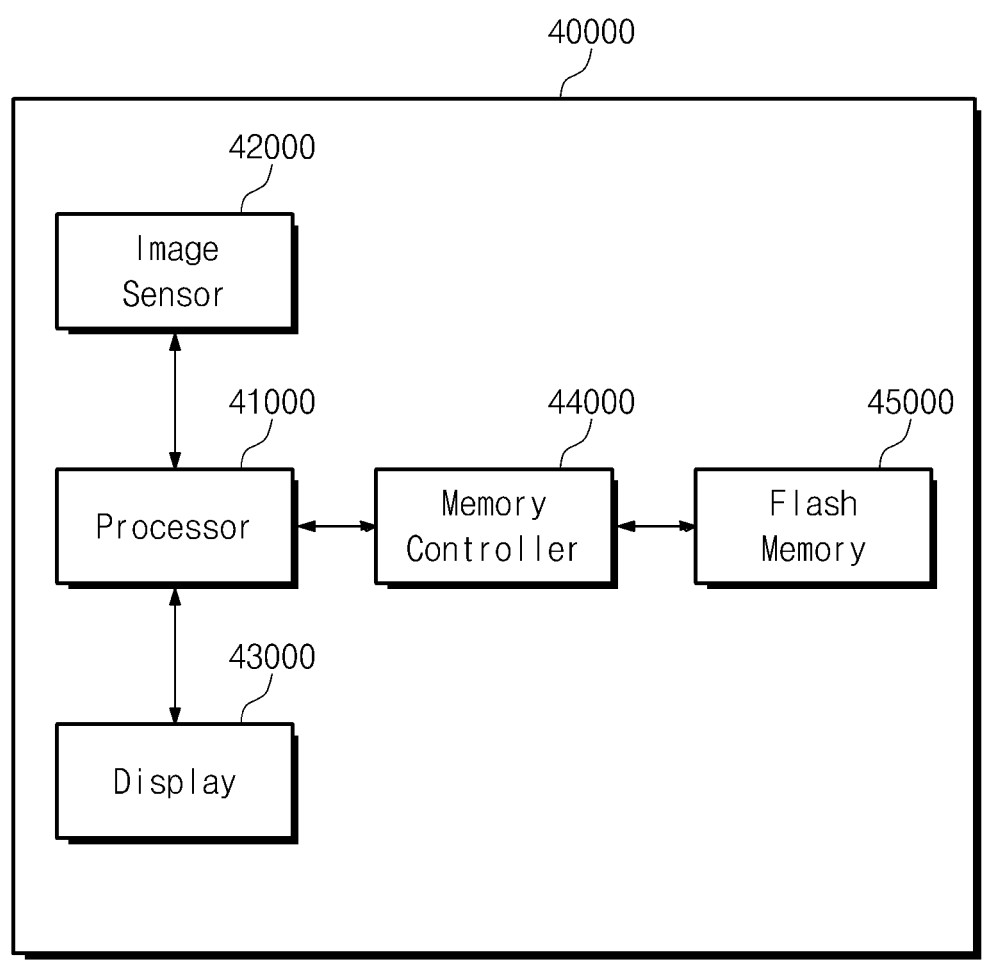
FIG. 19 is a block diagram schematically illustrating an electronic device including a memory controller and a non-volatile memory device according to still another embodiment of the inventive concept.

FIG. 19 is a block diagram schematically illustrating an electronic device including a memory controller and a non-volatile memory device according to still another embodiment of the inventive concept.

Referring to FIG. 19, an electronic device 40000 may include a non-volatile memory device 45000 (e.g., a flash memory device), a memory controller 44000 to control a data processing operation of the non-volatile memory device 45000, and a processor 41000 to control an overall operation of the electronic device 40000.

The non-volatile memory device 45000 may mean a non-volatile memory device as described previously in connection with FIGS. 1 to 15.

An image sensor 42000 of the electronic device 40000 may convert an optical signal into a digital signal, and the converted digital signal may be stored at the non-volatile memory device 45000 under the control of the processor 41000. Or, the converted digital signal may be displayed through a display 43000 under the control of the processor 41000.

Figure 20:
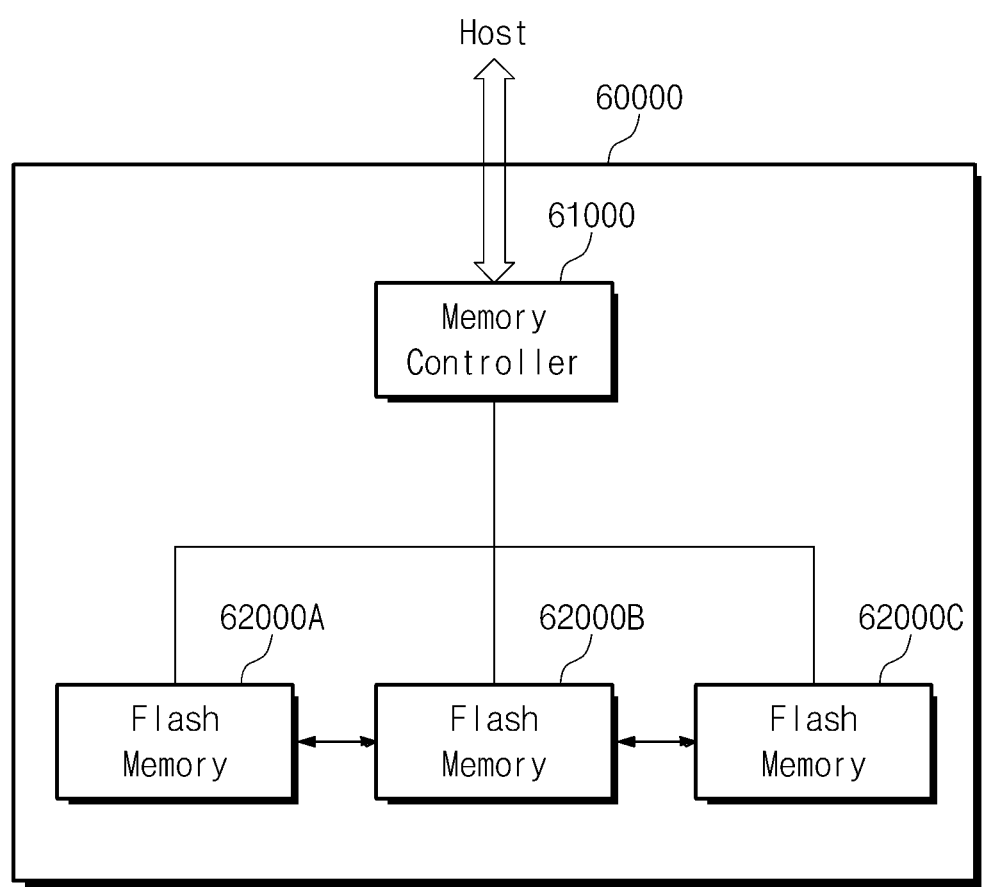
FIG. 20 is a block diagram schematically illustrating an electronic device including a memory controller and non-volatile memory devices according to still another embodiment of the inventive concept.

FIG. 20 is a block diagram schematically illustrating an electronic device 60000 including a memory controller 61000 and non-volatile memory devices 62000A, 62000B, and 62000C according to still another embodiment of the inventive concept.

Referring to FIG. 20, an electronic device 60000 may be implemented by a data storage device such as a solid state drive (SSD).

The electronic device 60000 may include non-volatile memory devices 62000A, 62000B, and 62000C and a memory controller 61000 to control a data processing operation of each of the non-volatile memory devices 62000A, 62000B, and 62000C.

The electronic device 60000 may be implemented by a memory system or a memory module.

Each of the non-volatile memory devices 62000A, 62000B, and 62000C may mean a non-volatile memory device as described previously in connection with FIGS. 1 to 15. The non-volatile memory devices 62000A, 620006, and 62000C may store random data.

The memory controller 61000 may be implemented outside or inside electronic device 60000 according to an embodiment.

Figure 21:
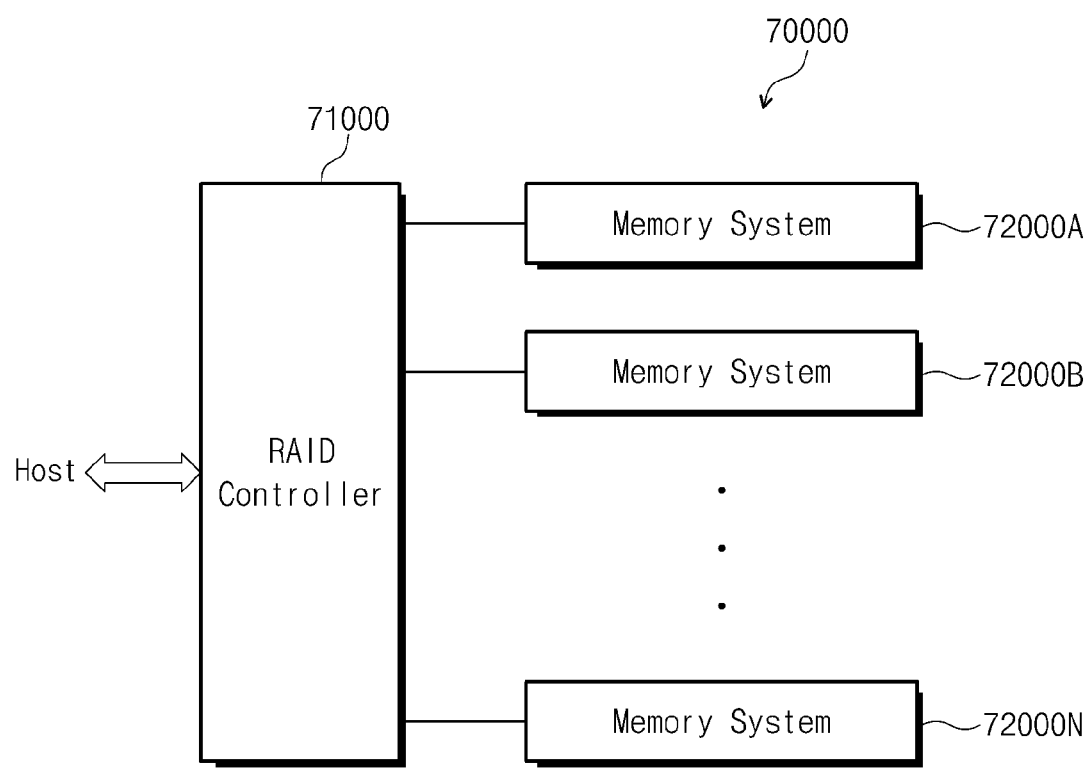
FIG. 21 is a block diagram of a data processing system including an electronic device illustrated in FIG. 20.

FIG. 21 is a block diagram of a data processing system including an electronic device illustrated in FIG. 20.

Referring to FIGS. 20 and 21, a data storage device 70000 may be implemented by a RAID (Redundant Array of Independent Disks) system. The data storage device 70000 may include a RAID controller 71000 and a plurality of memory systems 72000A to 72000N (N being a natural number).

Each of the memory systems 72000A to 72000N may be an electronic device 40000 in FIG. 19. The memory systems 72000A to 72000N may form an RAID array. The data storage device 70000 may be implemented by a personal computer or an SSD.

During a program operation, the RAID controller 71000 may output program data output from a host to one of the memory systems 72000A to 72000N according to one selected from a plurality of RAID levels based on RAID level information output from the host.

During a read operation, the RAID controller 71000 may transfer data read from one of the memory systems 72000A to 72000N to the host according to one selected from a plurality of RAID levels based on RAID level information output from the host.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A read method executed by a multi-level cell memory device which is connected with a memory controller, the method comprising:
    receiving a first read command;
    reading, in response to receiving the first read command, first and second hard decision data by performing first and second hard decision read operations using a first hard decision read voltage and a second hard decision read voltage, respectively, the second hard decision read voltage being different from the first hard decision read voltage;
    selecting one of the first and second hard decision read voltages as a selected hard decision read voltage;
    reading first soft decision data by performing a first soft decision read operation using a plurality of soft decision read voltages corresponding to the selected hard decision read voltage and having respective voltage levels which are different from each other and the voltage level of the selected hard decision read voltage;
    providing the first soft decision data to the memory controller for first error correction code (ECC) decoding;
    reading, in response to receiving from the memory controller a signal indicating a failure of the first ECC decoding on the first soft decision data, second soft decision data by performing a second soft decision read operation using a plurality of soft decision read voltages corresponding to the non-selected one of the first and second hard decision read voltages and having respective voltage levels which are different from each other and the voltage level of the non-selected one of the first and second hard decision read voltages; and
    providing the second soft decision data to the memory controller for second ECC decoding.

2. The read method of claim 1, further comprising, during execution of the first error correction code decoding, reading the second soft decision data by performing the second soft decision read operation using the plurality of soft decision read voltages and providing the second soft decision data to the memory controller for second ECC decoding.

3. A read method executed by a multi-level cell memory device which is connected with a memory controller, the method comprising:
    receiving a first read command;
    reading, in response to receiving the first read command, first and second hard decision data by performing first and second hard decision read operations using a first hard decision read voltage and a second hard decision read voltage, respectively, the second hard decision read voltage being different from the first hard decision read voltage;
    selecting one of the first and second hard decision read voltages as a selected hard decision read voltage;
    reading first soft decision data by performing a first soft decision read operation using a plurality of soft decision read voltages corresponding to the selected hard decision read voltage and having respective voltage levels which are different from each other and the voltage level of the selected hard decision read voltage; and
    providing the first soft decision data to the memory controller for first error correction code (ECC) decoding, wherein
    the selection of one of the first and second hard decision read voltages is made according to comparison results obtained using the first and second hard decision read data.

4. A read method executed by a multi-level cell memory device, the method comprising:
    receiving a first read command;
    performing, in response to receiving the first read command, first and second hard decision read operations using respective first and second hard decision read voltages, which are different from each other, to read first and second hard decision data;
    upon a failure of error bit correction on the first and second hard decision data, receiving a second read command;
    reading, in response to receiving the second read command, first soft decision data using a plurality of first soft decision read voltages corresponding to the first hard decision read voltage and having voltage levels that differ from each other and the voltage level of the first hard decision read voltage;

providing the first soft decision data to an external device for first error correction code (ECC) decoding;

reading, in response to receiving from the external device a signal indicating a failure of the first ECC decoding on the first soft decision data, second soft decision data by performing a second soft decision read operation using a plurality of second soft decision read voltages corresponding to the second hard decision read voltage and having respective voltage levels which are different from each other and the voltage level of the second hard decision read voltage; and providing the second soft decision data to the outside of the multi-level cell memory device for second ECC decoding.

5. The read method of claim 4, further comprising, during execution of the first ECC decoding, performing the second soft decision read operation using the plurality of second soft decision read voltages and providing the second soft decision data to the outside of the multi-level cell memory device for second ECC decoding.

* * * * *